(12) United States Patent
Orita et al.

(10) Patent No.: US 8,748,877 B2
(45) Date of Patent: Jun. 10, 2014

(54) MATERIAL FOR FORMING PASSIVATION FILM FOR SEMICONDUCTOR SUBSTRATE, PASSIVATION FILM FOR SEMICONDUCTOR SUBSTRATE AND METHOD OF PRODUCING THE SAME, AND PHOTOVOLTAIC CELL ELEMENT AND METHOD OF PRODUCING THE SAME

(75) Inventors: Akihiro Orita, Tsukuba (JP); Masato Yoshida, Tsukuba (JP); Takeshi Nojiri, Tsukuba (JP); Yoichi Machii, Tsukuba (JP); Mitsunori Iwamuro, Tsukuba (JP); Shuichiro Adachi, Tsukuba (JP); Tetsuya Sato, Tsukuba (JP); Toru Tanaka, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/480,549

(22) Filed: May 25, 2012

(65) Prior Publication Data

US 2012/0313199 A1 Dec. 13, 2012

Related U.S. Application Data

(60) Provisional application No. 61/490,396, filed on May 26, 2011, provisional application No. 61/490,368, filed on May 26, 2011.

(30) Foreign Application Priority Data

| May 26, 2011 | (JP) | 2011-118493 |
| May 26, 2011 | (JP) | 2011-118494 |
| Jun. 24, 2011 | (JP) | 2011-141068 |
| Mar. 13, 2012 | (JP) | 2012-055809 |

(51) Int. Cl.
*H01L 35/24* (2006.01)
*H01L 51/05* (2006.01)
*H01L 51/00* (2006.01)
*H01L 51/50* (2006.01)
*B82Y 10/00* (2011.01)

(52) U.S. Cl.
CPC ......... *H01L 51/0545* (2013.01); *H01L 51/0036* (2013.01); *H01L 51/0541* (2013.01); *H01L 51/5012* (2013.01); *B82Y 10/00* (2013.01)
USPC ............... 257/40; 257/E51.001; 257/431

(58) Field of Classification Search
CPC ............ H01L 51/0545; H01L 51/0036; H01L 51/0541; H01L 51/5012; B82Y 10/00
USPC .................... 257/431, 40, E51.001
See application file for complete search history.

(56) References Cited

U.S. PATENT DOCUMENTS

2009/0151782 A1 6/2009 Ko et al.

FOREIGN PATENT DOCUMENTS

| JP | 6-232438 A | 8/1994 |
| JP | 2000-7783 A | 1/2000 |
| JP | 3107287 B2 | 9/2000 |
| JP | 2004-6565 A | 1/2004 |
| JP | 2004-190008 A | 7/2004 |
| JP | 2009-270117 A | 11/2009 |
| JP | 2010-537423 A | 12/2010 |

* cited by examiner

OTHER PUBLICATIONS

Machine Translation of JP 2000-007783.*

*Primary Examiner* — Anthony Ho
(74) *Attorney, Agent, or Firm* — Miles & Stockbridge P.C.

(57) ABSTRACT

The invention provides a material for forming a passivation film for a semiconductor substrate. The material includes a polymer compound having an anionic group or a cationic group.

31 Claims, 3 Drawing Sheets

MATERIAL FOR FORMING PASSIVATION FILM FOR SEMICONDUCTOR SUBSTRATE, PASSIVATION FILM FOR SEMICONDUCTOR SUBSTRATE AND METHOD OF PRODUCING THE SAME, AND PHOTOVOLTAIC CELL ELEMENT AND METHOD OF PRODUCING THE SAME

CROSS-REFERENCE TO RELATED APPLICATION

This application claims priority under 35 USC 119(e) from U.S. Provisional Applications No. 61/490,368 and No. 61/490,396 filed May 26, 2011, the disclosure of which is incorporated by reference herein.

BACKGROUND OF THE INVENTION

1. Field of the Invention

The present invention relates to a material for forming a passivation film for a semiconductor substrate, a passivation film for a semiconductor substrate and a method of producing the same, and a photovoltaic cell element and a method of producing the same.

2. Background of the Invention

Conventional methods of producing silicon photovoltaic cell element will be explained.

First, a p-type silicon substrate, on which a texture is formed in order to improve efficiency by promoting a light-trapping effect, is prepared. Subsequently, a n-type diffusion layer is uniformly formed by carrying out treatment in an atmosphere of mixed gas of phosphorus oxychloride ($POCl_3$), nitrogen and oxygen, at from 800° C. to 900° C. for several ten minutes. According to the conventional method such as this, since diffusion of phosphorus is conducted by using a mixed gas, n-type diffusion layer are formed not only on a front surface but also on side and back surfaces. Therefore, side etching is carried out in order to remove the n-type diffusion layers formed on the side surfaces. Further, the n-diffusion layer formed on the back surface needs to be converted to a $p^+$-type diffusion layer. Therefore, ohmic contacts are obtained by printing an aluminum paste on the back surface and sintering the same, at the time of converting the n-type diffusion layer to a $p^+$-type diffusion layer.

However, an aluminum layer formed from an aluminum paste exhibits low conductivity. Therefore, in order to lower the sheet resistance, the aluminum layer formed on the entire back surface typically needs to have a thickness after sintering of about from 10 μm to 20 μm. Further, the coefficients of thermal expansion of silicon and aluminum are significantly different. Therefore, a large internal stress is created in a silicon substrate during sintering and cooling, and the internal stress may damage crystal grain boundaries, increase crystal defects or cause warpage.

In order to solve the problems as described above, there is a method of reducing the thickness of back-surface electrode layers by reducing the amount of an aluminum paste to be applied. However, if the amount of the aluminum paste is reduced, the amount of aluminum that diffuses into the inside of a p-type silicon semiconductor from its surface may be insufficient. As a result, a desired BSF (Back Surface Field) effect, i.e., an effect of improving collection efficiency of photogenerated carriers due to the presence of the $p^+$-type diffusion layer, may not be attained and the performances of the photovoltaic cell may be lowered.

In connection to the above, a technique of partially forming p+ layers and aluminum electrodes by applying an aluminum paste onto portions of a surface of a silicon substrate, referred to as point contacts, has been proposed (see, for example, Japanese Patent No. 3107287).

In a case of photovoltaic cells having a point-contact structure on a surface opposite to a light-receiving surface (hereinafter, also referred to as a back surface), the rate of recombination of minority carriers needs to be suppressed at surfaces corresponding to portions other than aluminum electrodes. In order to achieve this goal, films of $SiO_2$ and the like have been proposed as a passivation film for the back surface side (see, for example, Japanese Patent Application Laid-Open No. 2004-6565). The passivation film reduces the surface state density, which causes recombination, by terminating dangling bonds of silicon atoms at a surface portion of the back surface of the silicon substrate, by forming an oxide film on the back surface of the silicon substrate.

Further, a method of utilizing a film of $SiN_x$ (silicon nitride), which is widely used as an antireflection film for the light-receiving surface side, also as a passivation film for the back surface has been proposed (see, for example, Japanese Patent Application Laid-Open No. 2010-537423).

However, the $SiO_2$ film and the $SiN_x$ film proposed in Patent Document 2 and Patent Document 3 are typically formed via a thermal oxidation method or a CVD method. In a thermal oxidation method, performing a high-temperature treatment at 1000° C. or higher is generally necessary, and process conditions, such as gas a flow rate or a gas flow rate distribution, need to be controlled.

In addition, when a CVD apparatus is used, there is a case in which an effect of hydrogen passivation caused by decomposition of a reactant gas may be expected depending on the type of the reactive gas. However, there are problems in that the throughput is low and that the production costs are high due to the need for frequent maintenances. In addition, since formation of openings in a passivation film for a back side is typically carried out by photolithography, there are problems in terms of the number of processes, production costs and the like.

SUMMARY OF THE INVENTION

The invention has been made in view of the problems as described above, and aims to provide a material for forming a passivation film for a semiconductor substrate, the material being capable of forming a passivation film for a semiconductor substrate that exhibits favorable passivation characteristics by a simple method.

The invention also aims to provide a passivation film for a semiconductor substrate formed from the material for forming a passivation film for a semiconductor substrate, and a method of producing the same.

The invention further aims to provide a photovoltaic cell element having the passivation film for a semiconductor substrate, and a method of producing the same.

Means for Solving the Problems

The following are specific embodiments for solving the problems.

<1> A material for forming a passivation film for a semiconductor substrate, the material comprising a polymer compound having an anionic group or a cationic group.

<2> The material for forming a passivation film for a semiconductor substrate according to <1>, wherein the polymer compound has a main chain formed from carbon and at least one element selected from the group consisting of hydrogen, fluorine, oxygen and sulfur.

<3> The material for forming a passivation film for a semiconductor substrate according to <1> or <2>, wherein the polymer compound has a main chain formed from carbon and at least one element selected from the group consisting of hydrogen, oxygen and sulfur.

<4> The material for forming a passivation film for a semiconductor substrate according to any one of <1> to <3>, wherein the polymer compound has an aromatic group.

<5> The material for forming a passivation film for a semiconductor substrate according to any one of <1> to <4>, wherein the polymer compound has a main chain formed from carbon and fluorine.

<6> The material for forming a passivation film for a semiconductor substrate according to any one of <1> to <5>, wherein the polymer compound has a conductivity of 1 mS/cm or more in water at 25° C.

<7> The material for forming a passivation film for a semiconductor substrate according to any one of <1> to <6>, wherein the polymer compound has at least one anionic group selected from the group consisting of a sulfonic acid group, a carboxy group, a phosphoric acid group, a phosphonic acid group and a phenolic hydroxy group.

<8> The material for forming a passivation film for a semiconductor substrate according to any one of <1> to <7>, wherein the polymer compound has a sulfonic acid group.

<9> The material for forming a passivation film for a semiconductor substrate according to any one of <1> to <8>, wherein the polymer compound is at least one selected from the group consisting of a polyperfluoroolefin sulfonic acid derivative, a sulfonated polystyrene derivative and a sulfonated polyarylethersulfone.

<10> The material for forming a passivation film for a semiconductor substrate according to any one of <1> to <9>, further comprising a filler.

<11> The material for forming a passivation film for a semiconductor substrate according to <10>, wherein the filler is an inorganic filler.

<12> The material for forming a passivation film for a semiconductor substrate according to <11>, wherein the inorganic filler comprises at least one selected from the group consisting of $Al_2O_3$, $SiO_2$, $ZrO_2$, $TiO_2$, SiC, MgO, zeolite, AlN and BN.

<13> The material for forming a passivation film for a semiconductor substrate according to <11> or <12>, wherein the inorganic filler comprises $SiO_2$.

<14> The material for forming a passivation film for a semiconductor substrate according to any one of <10> to <13>, wherein the filler has a weight-average particle size (50% D) of from 10 nm to 30 μm.

<15> The material for forming a passivation film for a semiconductor substrate according to any one of <10> to <14>, wherein a content of the filler with respect to a total content of the polymer compound is from 0.1% by mass to 200% by mass.

<16> The material for forming a passivation film for a semiconductor substrate according to any one of <1> to <15>, further comprising a metal alkoxide.

<17> The material for forming a passivation film for a semiconductor substrate according to <16>, wherein the metal alkoxide comprises a silicon alkoxide.

<18> The material for forming a passivation film for a semiconductor substrate according to <16> or <17>, further comprising at least one acidic compound.

<19> The material for forming a passivation film for a semiconductor substrate according to any one of <16> to <18>, wherein a content of the metal alkoxide with respect to a total content of the polymer compound is from 0.1% by mass to 200% by mass.

<20> The material for forming a passivation film for a semiconductor substrate according to any one of <1> to <19>, further comprising a liquid medium.

<21> The material for forming a passivation film for a semiconductor substrate according to <20>, wherein the liquid medium comprises at least one selected from the group consisting of methanol, ethanol, 1-propanol and 2-propanol.

<22> A passivation film for a semiconductor substrate that is a coating film formed on a semiconductor substrate from the material for forming a passivation film for a semiconductor substrate according to any one of <1> to <21>.

<23> A method of producing a passivation film for a semiconductor substrate, the method comprising:

forming a coating layer by applying the material for forming a passivation film for a semiconductor substrate according to any one of <1> to <21>; and forming a coating film by drying the coating layer.

<24> The method of producing a passivation film for a semiconductor substrate according to <23>, further comprising applying hydrofluoric acid to the semiconductor substrate prior to the formation of the coating layer.

<25> A photovoltaic cell element comprising a semiconductor substrate having a pn junction, an electrode, and the passivation film for a semiconductor substrate according to <22>, wherein the passivation film is formed on the semiconductor substrate.

<26> A method of producing a photovoltaic cell element, the method comprising forming the passivation film for a semiconductor substrate according to <22> on a semiconductor substrate that has a pn junction and has an electrode formed thereon.

Effect of the Invention

According to the invention, it is possible to provide a material for forming a passivation film for a semiconductor substrate, the material being capable of forming a passivation film for a semiconductor substrate that exhibits favorable passivation characteristics by a simple method. Further, according to the invention, it is possible to provide a passivation film for a semiconductor substrate formed from the material for forming a passivation film for a semiconductor substrate, and a method of producing the same. Moreover, according to the invention, it is possible to provide a photovoltaic cell element having the passivation film for a semiconductor substrate, and a method of producing the same.

DETAILED DESCRIPTION OF THE INVENTION

Embodiments for Implementing the Invention

Figure 1:
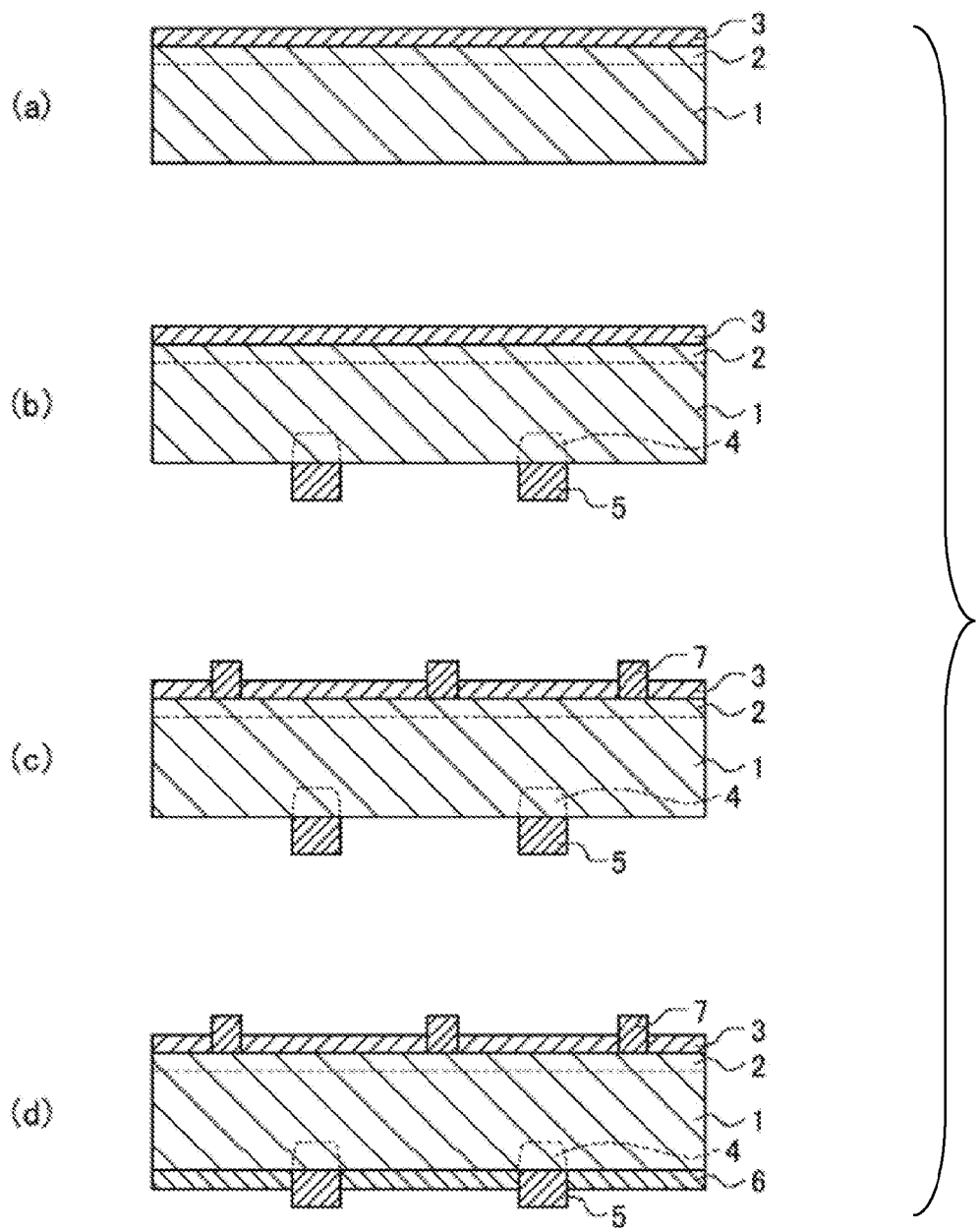
FIG. 1 is a schematic sectional view showing an example of a method of producing a photovoltaic cell element having a passivation film for a semiconductor substrate according to an embodiment of the present invention.

In the present specification, the term "process" refers not only to an independent process but also to a process that cannot be clearly distinguished from another process, insofar as the purpose of the process is achieved. Further, a numerical range expressed by "A to B" refers to a range that includes A and B as the minimum value and the maximum value, respectively.

With regard to the amount of components of a composition, when plural substances corresponding to the same component exist in the composition, the amount of the component refers to the total amount of the plural substances, unless otherwise specified.

<Material for Forming Passivation Film for Semiconductor Substrate>

The material for forming a passivation film for a semiconductor substrate according to the invention includes at least one kind of a polymer compound having an anionic group or a cationic group (hereinafter, also referred to as a specific resin). As necessary, the material for forming a passivation film for a semiconductor substrate may include other components such as a liquid medium, a filler or a metal alkoxide.

By forming a coating film by coating a semiconductor substrate with the material for forming a passivation film for a semiconductor substrate that includes at least one kind of the specific resin, a passivation film that exhibits a favorable surface passivation effect can be formed at desired portions by a simple method.

This is considered to be, for example, because defects can be terminated as a result of causing reaction or interaction between the defects that exist on the surface of a semiconductor substrate and ions that have dissociated from an anionic group or a cationic group, which is a dissociative group. For example, it is believed that dangling bonds that act as defects can be terminated through reaction between protons that have dissociated from protonic anionic groups and the dangling bonds. Further, it is believed that the defects can be terminated by allowing electrons that exist at the defects to be accepted by dissociated cationic groups.

In the present specification, the surface passivation effect of the passivation film for a semiconductor substrate can be evaluated by measuring the effective lifetime of minority carriers in a semiconductor substrate provided with a passivation film for a semiconductor substrate, by a microwave reflectance photoconductivity decay method.

The effective lifetime $\tau$ is expressed by the following formula (1) in which $\tau_b$ represents a bulk lifetime inside a silicon substrate and $\tau_s$ represents a surface lifetime at the surface of a silicon substrate. In a case in which the surface state density at the surface of the silicon substrate is small, the value of $\tau_s$ is large and whereby the effective life time $\tau$ is large. Alternatively, in a case in which the number of defects such as dangling bonds inside the silicon substrate is small, the bulk life time $\tau_b$ is large and whereby the effective life time $\tau$ is large. Accordingly, interfacial characteristics between a passivation film and a silicon substrate and internal characteristics of a semiconductor substrate such as dangling bonds can be evaluated by measuring the effective lifetime $\tau$.

$$1/\tau = 1/\tau_b + 1/\tau_s \quad (1)$$

The longer the effective lifetime is, the slower the rate of recombination of minority carriers is. It is generally known that photovoltaic cells having a substrate with a long effective lifetime exhibit improved conversion efficiency.

In the present invention, a passivation film for a semiconductor substrate can be formed on a semiconductor substrate by forming a coating film by coating the semiconductor substrate with the material for forming a passivation film for a semiconductor substrate that contains the specific resin.

Further, in the present invention, it is suitable to select a polymer compound for forming a passivation film for a semiconductor substrate according to the type of fixed charge of a dopant that exists at the surface of the semiconductor substrate or the inside thereof. Specifically, it is suitable to select a polymer compound having a positive fixed charge for a semiconductor substrate having a n-type layer or a $n^+$-type diffusion layer at the surface thereof. On the other hand, it is suitable to select a polymer compound having a negative fixed charge for a semiconductor substrate having a p-type layer or a $p^+$-type diffusion layer at the surface thereof.

By selecting the polymer compound in this manner, minority carriers can be turned away from the electric field effect caused by band bending, thereby enabling further improvement in efficiency of a photovoltaic cell element.

Further, in a case in which the fixed charge of the polymer compound is small, for example, with an interfacial fixed charge density of approximately from $10^7$ cm$^{-2}$ to $10^{12}$ cm$^{-2}$, the effect of band bending due to fixed charge at an interface between a passivation film and a semiconductor substrate becomes small. Therefore, it is possible to select a polymer compound for forming a passivation film for a semiconductor substrate irrespective of the type of the fixed charge.

The fixed charge that exists in the polymer compound can be calculated from a voltage-capacity curve that is obtained by forming a passivation film on a silicon substrate and then forming an aluminum electrode of a desired size, e.g., 1 mm in diameter, by masking the passivation film and carrying out evaporation.

[Polymer Compound]

The polymer compound having an anionic group or a cationic group (specific resin) is not particularly limited and may be selected from compounds typically used, as long as it has a main chain that constitutes the polymer compound and a side chain that has an anionic group or a cationic group and is bonded to the main chain. The polymer compound having an anionic group or a cationic group may be a polymer or an oligomer.

The specific resin may be a resin used as an ion exchange resin, for example.

The main chain of the specific resin is not particularly limited, and may be a hydrocarbon main chain or a fluorocarbon main chain.

Examples of the oligomer or the polymer that constitutes a hydrocarbon main chain include polyether ketone, polysulfide, polyphosphazene, polyphenylene, polybenzoimidazole, polyether sulfone, polyaryl ether sulfone, polyphenylene oxide, polycarbonate, polyurethane, polyamide, polyimide, polyurea, polysulfone, polysulfonate, polybenzoxazole, polybenzothiazole, polythiazole, polyphenylquinoxaline, polyquinoline, polysiloxane, polytriazine, polydiene, polypyridine, polypyrimidine, polyoxathiazole, polytetraazapyrene, polyoxazole, polyvinylpyridine, polyvinylimidazole, polypyrrolidone, polyacrylate derivatives, polymethacrylate derivatives, and polystyene derivatives.

Preferred examples of the oligomer or the polymer that constitutes a hydrocarbon main chain include polyether ketone, polysulfide, polyphosphazene, polyphenylene, polybenzoimidazole, polyether sulfone, polyaryl ether sulfone, polyphenylene oxide, polycarbonate, polyurethane, polyamide, polyimide, polyurea, polysulfone, polysulfonate, polybenzoxazole, polybenzothiazole, polyphenylquinoxaline, polyquinoline, polytriazine, polydiene, polypyridine, polyoxathiazole, polyacrylate derivatives, polymethacrylate derivatives, and polystyene derivatives.

More preferred examples of the oligomer or the polymer that constitutes a hydrocarbon main chain include polyether ketone, polysulfide, polyphosphazene, polyphenylene, polybenzoimidazole, polyether sulfone, polyphenylene oxide, polycarbonate, polyamide, polyimide, polyurea, polysulfone, polysulfonate, polybenzoxazole, polybenzothiazole, polyphenylquinoxaline, polyquinoline, polytriazine, polydiene, polyacrylate derivatives, polymethacrylate derivatives, polystyene derivatives and phenol resin derivatives.

Examples of the polymer and the oligomer that constitutes a fluorocarbon main chain include polyperfluoroolefin resins such as polyperfluoroethylene, polyperfluoropropene and polyperfluoroalkoxyalkene, and polyfluoroolefin resins having a structure in which part of fluorine atoms in a polyperfluoroolefin resin are substituted by hydrogen atoms.

The main chain of the specific resin is preferably a main chain formed from carbon and at least one kind of element selected from the group consisting of hydrogen, fluorine, oxygen and sulfur, from the viewpoint of the surface passivation effect and the ease of producing the polymer compound; more preferably a main chain that is formed from carbon and at least one kind of element selected the group consisting of hydrogen, oxygen and sulfur; further preferably a main chain that is formed from carbon and at least one kind of element selected the group consisting of hydrogen, oxygen and sulfur, and contains an aromatic group.

From the viewpoint of the surface passivation effect and the chemical durability, a main chain formed from carbon and fluorine is also preferred as the main chain of the specific resin.

Specific examples of the main chain of the specific resin include polystyrene derivatives such as styrene-olefin copolymer and polystyrene, polyaryl ether sulfone, polyether ketone, polyamide, polyimide, and polyperfluoroolefin. The main chain is preferably at least one kind selected from the group consisting of polystyrene derivatives such as styrene-olefin copolymer and polystyrene, polyaryl ether sulfone and polyperfluoroolefin.

The specific resin preferably has a structure in which a side chain having an anionic group or a cationic group is bonded to the main chain. There is no particular restriction on how the side chain having an anionic group or a cationic group is bonded to the main chain. The anionic group or the cationic group may be directly bonded to the main chain, or the anionic group or the cationic group may be bonded to the main chain via a divalent linking group.

In a case in which the anionic group or the cationic group is bonded to the main chain via a divalent linking group, the divalent linking group is not particularly restricted as long as it is capable of linking the anionic group or the cationic group to the main chain. For example, the divalent linking group is preferably formed from at least one kind of element selected from the group consisting of carbon, hydrogen, fluorine and oxygen.

Specific examples of the divalent linking group include an alkylene group, an alkyleneoxy group, an arylene group, an aryleneoxy group, a perfluoroalkylene group, a perfluoroalkyleneoxy group, and a combination of these groups.

The anionic group in the polymer compound having an anionic group is preferably at least one kind selected from the group consisting of a sulfonic acid group, a carboxy group, a phosphoric acid group, a phosphonic acid group, a phenolic hydroxy group and salts of these groups, more preferably at least one kind selected from the group consisting of a sulfonic acid group, a carboxy group and a phosphoric acid group, further preferably a sulfonic acid group.

By selecting the anionic group as mentioned above, it is possible to impart a fixed charge to a passivation film for a semiconductor substrate with high efficiency.

The sulfonic acid group, the carboxy group, the phosphonic acid group, the phosphoric acid group and the phenolic hydroxy group are preferably functional groups represented by —$SO_3^-X^+$, —$COO^-X^+$, —$PO_3^{2-}X^+Y^+$, —$OPO_3^{2-}X^+Y^+$ and —Ar—$O^-X^+$, respectively.

In the formulae, each of $X^+$ and $Y^+$ independently represents a proton ($H^+$), a monovalent metallic cation, $NH_4^+$, $NH_3R^+$, $NH_2R_2^+$, $NHR_3^+$, $NR_4^+$ or a pyridinium ion. Each of R independently represents an alkyl group or an aryl group. When there are two or more of R, the two or more of R may be the same or different from each other. Ar represents an arylene group.

Among the functional groups as mentioned above, the polymer compound having an anionic group is preferably a polymer compound at least having a sulfonic acid group, more preferably a polymer compound having a protonic sulfonic acid group (—$SO_3H$).

Although the details of the reason are not clear, if the material for forming a passivation film for a semiconductor substrate at least contains a polymer compound having a sulfonic acid group, the passivation effect tends to be more excellent. This is considered to be, for example, as follows.

Generally, a sulfonic acid group has a large ion dissociation degree and is highly conductive. For this reason, the sulfonic acid group is suitably used for a proton-conductive electrolyte film for solid polymer fuel cells and direct methanol fuel cells. It is considered that a sulfonic acid group having a high ion dissociation degree reacts with defects that exist inside the semiconductor substrate or on the surface of the semiconductor substrate, thereby reducing the number of recombination centers that exist in the semiconductor substrate, whereby an excellent passivation effect is achieved. In particular, in a case in which the sulfonic acid group is proton type, dangling bonds can be terminated efficiently through reaction of the dangling bonds and protons. Further, in a case in which the semiconductor substrate is washed with hydrofluoric acid or the like prior to the formation of a passivation film for a semiconductor substrate, it is believed that the dangling bonds are hydrogenated and terminated by the treatment with hydrofluoric acid. It is also believed that the terminated state is stabilized by covering with a polymer compound having a sulfonic acid group after the treatment with hydrofluoric acid.

From the viewpoint of the surface passivation effect and adhesiveness with respect to a semiconductor substrate, the polymer compound having an anionic group according to the invention is preferably at least one kind selected from the group consisting of polyperfluoroolefin sulfonic acid derivatives such as NAFION (registered trade name, manufactured by DuPont), perfluoroolefin carboxylic acid derivatives such as FLEMION (registered trade name, manufactured by Asahi Glass Co., Ltd.), sulfonated polystyrene derivatives such as sulfonated polystyrene and sulfonated styrene-olefin copolymer, sulfonated polyether ketone, sulfonated polyamide, sulfonated polyimide and sulfonated polyaryl ether sulfone; more preferably at least one kind selected from the group consisting of polyperfluoroolefin sulfonic acid derivatives, sulfonated polystyrene derivatives and sulfonated polyaryl ether sulfone.

The cationic group in the polymer compound having a cationic group is preferably at least one kind selected from the group consisting of a pyridinium group, an alkyl ammonium group and an imidazolium group.

By selecting the cationic group as mentioned above, it is possible to impart a fixed charge to a passivation film for a semiconductor substrate with high efficiency.

Examples of the polymer compound having a cationic group include compounds obtained by quaternizing poly-4-vinyl pyridine, poly-2-vinyl pyridine, poly-2-methyl-5-vinyl pyridine and poly-1-pyridin-4-yl carbonyloxyethylene. Quaternization of poly-4-vinyl pyridine can be carried out by allowing the compound to react with an alkyl halide such as methyl bromide or ethyl bromide. It is also possible to obtain a polymer compound having a cationic group by polymerizing a quaternized monomer such as an ammonium vinyl monomer or an imidazolium vinyl monomer.

The content of the anionic group or the cationic group in the polymer compound having an anionic group or a cationic group (specific compound) may be appropriately selected according to purposes. In particular, from the viewpoint of the surface passivation effect, the content is preferably determined such that the conductivity of the specific resin in pure water at 25° C. is 1 mS/cm or more, more preferably from 4 mS/cm to 30 mS/cm. When the conductivity of the specific resin is 1 mS/cm or more, a sufficient passivation effect tends to be attained. When the conductivity is 30 mS/cm or less, the passivation film tends to be chemically stable and a favorable durability tends to be attained.

The conductivity of the specific resin can be measured in accordance with the following method. When the specific resin is insoluble in water, the specific resin is processed into a rectangular film sample, and the sample is pressed at both sides with platinum plates and immersed in pure water at 25° C. Then, the resistance at a frequency of from 0.1 Hz to 1 MHz is measured, and the resistance between the electrodes is measured from the Cole-Cole plot. The resistance as measured (gradient in resistance between electrodes) is applied to the following formula (2), and the conductivity of the specific resin is calculated.

$$\text{Conductivity [mS/cm]}=1/(\text{film width [cm]}\times\text{film thickness [cm]}\times\text{gradient in resistance between electrodes [}\Omega\text{/cm]}\times 100) \quad \text{formula (2)}$$

When the specific resin is soluble in water, the conductivity of the specific resin can be measured by preparing an aqueous solution of the specific resin. In that case, the concentration of the specific resin in water is adjusted to 3% by mass, and the conductivity is measured at 25° C. with an electrical conductivity analyzer.

In the present specification, a specific resin that is insoluble in water refers to a specific resin that dissolves in pure water at 25° C. by less than 3% by mass. A specific resin that is soluble in water refers to a specific resin that dissolves in pure water at 25° C. by 3% by mass or more.

The content of the anionic group or the cationic group in the specific polymer may be selected appropriately according to purposes. In particular, from the viewpoint of the surface passivation effect, the ion exchange capacity of the polymer compound is preferably from 0.01 mmol/g to 10 mmol/g, more preferably from 0.1 mmol/g to 5 mmol/g. When the ion exchange capacity of the polymer compound having an anionic group or a cationic group included in the material for forming a passivation film is 0.01 mmol/g or more, a sufficient passivation effect tends to be easily attained.

The molecular weight of the specific resin may be selected appropriately without any particular restriction. The weight-average molecular weight of the specific resin is preferably from 100 to 1000000, more preferably from 500 to 500000, further preferably from 1000 to 300000. When the weight-average molecular weight is 1000000 or less, processability may be improved and a more uniform surface passivation effect may be attained.

The weight-average molecular weight of the specific resin is measured by gel permeation chromatography (GPC) by an ordinary method (converting by a calibration curve based on polystyrene standard).

The specific resin may be produced as a polymer compound having a desired structure by an ordinary method. Alternatively, a resin that is commercially available as an ion exchange resin may be used.

In the following, an example of the method of producing the specific resin will be explained.

For example, the polymer compound may be produced by polymerizing a monomer composition including at least one kind of a monomer having an anionic group, and a monomer not having an anionic group, as necessary.

For example, in a case of producing a polymer compound having a sulfonic acid group, the sulfonic acid group-containing monomer used for the production may be a commercially available product or a self-produced product. The sulfonating agent that is used for producing a sulfonic acid group-containing monomer is not particularly restricted. Suitable examples of the sulfonating agent include concentrated sulfuric acid, fuming sulfuric acid, chlorosulfuric acid and anhydrous sulfuric acid complexes.

The production of a sulfonic acid group-containing monomer may be carried out by using the reagent as mentioned above, and by selecting the reaction conditions appropriately according to the structure of the compound.

In addition to the sulfonating agents as mentioned above, it is also possible to use the sulfonating agents described in Japanese Patent No. 2884189 including 1,3,5-trimethylbenzene-2-sulfonic acid, 1,3,5-trimethylbenzene-2,4-disulfonic acid, 1,2,4-trimethylbenzene-5-sulfonic acid, 1,2,4-trimethylbenzene-3-sulfonic acid, 1,2,3-trimethylbenzene-4-sulfonic acid, 1,2,3,4-tetramethylbenzene-5-sulfonic acid, 1,2,3,5-tetramethylbenzene-4-sulfonic acid, 1,2,4,5-tetramethylbenzene-3-sulfonic acid, 1,2,4,5-tetramethylbenzene-3,6-disulfonic acid, 1,2,3,4,5-pentamethylbenzene-6-sulfonic acid, 1,3,5-triethylbenzene-2-sulfonic acid, 1-ethyl-3,5-dimethylbenzene-2-sulfonic acid, 1-ethyl-3,5-dimethylbenzene-4-sulfonic acid, 1-ethyl-3,4-dimethylbenzene-6-sulfonic acid, 1-ethyl-2,5-dimethylbenzene-3-sulfonic acid, 1,2,3,4-tetraethylbenzene-5-sulfonic acid, 1,2,4,5-tetraethylbenzene-3-sulfonic acid, 1,2,3,4,5-pentaethylbenzene-6-sulfonic acid, 1,3,5-triisopropylbenzene-2-sulfnic acid, and 1-propyl-3,5-dimethylbenzene-4-sulfonic acid.

Among the sulfonating agents, compounds having lower alkyl groups substituting at ortho positions on both sides of the sulfonic acid group, such as 1,3,5-trimethylbenzene-2-sulfonic acid, 1,2,4,5-tetramethylbenzene-3-sulfonic acid, 1,2,3,5-tetramethylbenzene-4-sulfonic acid, 1,2,3,4,5-pentamethylbenzene-6-sulfonic acid, 1,3,5-trimethylbenzene-2,4-disulfonic acid and 1,3,5-triethylbenzene-2-sulfonic acid are preferred, and 1,3,5-trimethylbenzene-2-sulfonic acid is more preferred.

The monomer used as a raw material for producing a sulfonic acid group-containing monomer is not particularly restricted as long as it has a polymerizable group and a functional group that can be sulfonated in the molecule. Examples of the monomer include styrene, divinyl biphenyl, divinyl benzene, methyl styrene, dimethyl styrene and trimethyl styrene.

In the production of the sulfonic acid group-containing monomer, the sulfonating agent is preferably added in an amount of from 30 parts by mass to 5000 parts by mass, more preferably from 50 parts by mass to 2000 parts by mass, with respect to 100 parts by mass of the monomer raw material.

If the amount of the sulfonating agent to be added is 30 parts by mass or more, progress in the sulfonation reaction tends to be sufficient. If the amount of the sulfonating agent to be added is 5000 parts by mass or less, disposal of the sulfonating agent after the reaction tends to be easy to conduct.

The organic solvent used in the sulfonation of the monomer raw material is not particularly restricted, and may be selected from known organic solvents as long as it does not adversely affect the sulfonation reaction.

Specific examples of the organic solvent include halogenated aliphatic hydrocarbon solvents such as chloroform, dichloromethane, 1,2-dichloroethane, trichloroeethane, tetrachloroethane, trichloroethylene and tetrachloroethylene; halogenated aromatic hydrocarbon solvents such as dichlorobenzene and trichlorobenzene; nitro compounds such as nitromethane and nitrobenzene; alkylbenzene compounds such as trimethylbenzene, tributylbenzene, tetramethylbenzene and pentamethylbenzene; heterocyclic compounds such as sulfolane; linear, branched or cyclic aliphatic saturated hydrocarbon solvents such as octane, decane and cyclohexane; aprotic polar solvents such as N,N-dimethyl acetamide, N,N-dimethyl formamide, dimethyl sulfoxide, N-methyl-2-pyrrolidone and hexamethyl phosphonamide; alcohol solvents such as methanol and ethanol; and phenol solvents such as phenol and cresol. The organic solvent may be selected from these organic solvents, but the invention is not limited thereto.

The organic solvent may be used alone or in combination of two or more kinds. The amount of the solvent may be selected as appropriate, and is typically preferably from 100 parts by mass to 2000 parts by mass with respect to 100 parts by mass of the sulfonating agent.

If the amount of the solvent is 100 parts by mass or more, the sulfonation reaction tends to progress more uniformly. If the amount of the solvent is 2000 parts by mass or less, separation of the solvent and the sulfonating agent after the reaction and collection of the solvent tend to be easy to conduct.

The sulfonation reaction may be, for example, performed at a reaction temperature of from $-20°$ C. to $150°$ C. and a reaction time of from 0.5 hours to 50 hours.

If the reaction temperature is $-20°$ C. or higher, the sulfonation reaction progresses efficiently. If the reaction temperature is $150°$ C. or less, introduction of a sulfonic acid group only to a particular aromatic ring tends to be easy to conduct.

The polymer compound having a sulfonic acid group may be produced by directly sulfonating a polymer compound that does not have a sulfonic acid group. The sulfonation can be performed, for example, by allowing polystyrene, polyaryl ether sulfone, polyether ketone, polyimide or polyamide to disperse in concentrated sulfuric acid, or by allowing the same to contact with fuming sulfuric acid, at a reaction temperature of from $-20°$ C. to $120°$ C. and a reaction time of from 0.5 hours to 50 hours.

In a case of synthesizing a polymer compound having a carboxy group, a phosphonic acid group or a phosphoric acid group, it is preferred to synthesize the polymer compound from a monomer having a carboxy group, a phosphonic acid group or a phosphoric acid group. In a case of synthesizing a polymer compound having a phenolic hydroxy group, it is preferred to synthesize the polymer compound from phenol or a phenol derivative as a monomer.

In a case of producing a polymer having an anionic group, a monomer not having an anionic monomer may be used in combination. The monomer not having an anionic group is not particularly restricted as long as it can polymerize with a monomer having an anionic group, and may be appropriately selected according to the type of the monomer having an anionic group.

Specific examples of the monomer not having an anionic group include styrene, vinyl acetate, biphenyl derivatives, phenyl ether derivatives and benzene derivatives.

The method of polymerizing a monomer composition at least containing a monomer having an anionic group is not particularly restricted, and may be selected appropriately according to the type of the monomer composition.

For example, a polymer compound having an anionic group can be produced by polymerizing the monomer composition in accordance with an ordinary method by using a thermal polymerization initiator or the like.

As the method of purifying the polymer compound having an anionic group, obtained by polymerizing the monomer composition at least containing a monomer having an anionic group, a known purification method may be suitably applied. For example, in a case in which the obtained polymer compound having an anionic group is in a solid form, it can be purified by washing with a solvent or the like after filtration, and then drying. In a case in which the obtained polymer compound having an anionic group is in an oil form, it can be purified by carrying out separation. In a case in which the obtained polymer compound having an anionic group is dissolved in a reaction solution, it can be purified by removing an organic solvent by evaporation.

Alternatively, the polymer compound having an anionic group may be purified by adding water and an optional alkali component to a reaction solution containing the polymer compound having an anionic group obtained by polymerizing a monomer composition at least containing a monomer having an anionic group, allowing the polymer compound to dissolve in water, separating the reaction solution into a solvent phase and an aqueous phase, allowing the polymer compound to precipitate from the aqueous phase by a method such as acid precipitation or salting out, filtrating and drying the precipitate, and then drying the precipitate.

The polymer compound having an anionic group may be produced also by condensation reaction of a monomer having an anionic group and two or more functional groups capable of substitution reaction and a monomer having two or more functional groups capable of substitution reaction with the monomer.

In a case of producing a polymer compound having an anionic group by condensation reaction, it can be produced in a solvent under the presence of a catalyst. The amount of the catalyst may be from 0.1 to 100 times with respect to the total moles of the monomer to be reacted.

The reaction temperature may be from $0°$ C. to $350°$ C., preferably from $40°$ C. to $260°$ C. The reaction time may be from 2 hours to 500 hours.

A polymer compound having a cationic group can be produced by a method similar to the method of producing a polymer compound having an anionic group, as mentioned above, by replacing the monomer having an anionic group with a monomer having a cationic group.

The material for forming a passivation film for a semiconductor substrate preferably include, as a specific resin, at least one of a polymer compound having an anionic group or a polymer compound having a cationic group. The polymer compound having an anionic group or the polymer compound having a cationic group, included in the material for forming a passivation film for a semiconductor substrate, may be used alone or as a combination of two or more kinds.

The content of the specific resin in the material for forming a passivation film for a semiconductor substrate is preferably from 0.1 parts by mass to 95 parts by mass, more preferably from 1 part by mass to 80 parts by mass, further preferably from 3 parts by mass to 50 parts by mass, in 100 parts by mass of the material for forming a passivation film for a semiconductor substrate.

If the content of the specific resin is 0.1 parts by mass or more, a passivation effect that is sufficient for a passivation film for a semiconductor substrate can be attained.

(Filler)

The material for forming a passivation film for a semiconductor substrate preferably includes at least one kind of filler. By including a filler, the passivation film for a semiconductor substrate tends to exhibit improved mechanical strength, water retentivity, reflection ratio and heat resistance. Further, the passivation effects tend to be maintained even after subjecting a semiconductor substrate on which a passivation film has been formed to a high-temperature treatment.

The filler is not particularly restricted and may be either an organic filler or an inorganic filler. The filler is preferably an inorganic filler from the viewpoint of mechanical strength, moisture-retaining property, reflection ratio and heat resistance.

Examples of a resin that constitutes an organic filler include polyamide, polyester, polyether, polysulfide, polyolefin, fluorinated resin and polyvinyl alcohol. Specific examples include polyamide such as nylon 46 (PA 46), nylon 6 (PA 6), nylon 66T (PA 66T), nylon 610 (PA 610), nylon 66 (PA 66), nylon 6T (PA 6T) and PA•MXD6; polyester such as polyethylene terephthalate (PET), polyisobutylene terephthalate (PBT), polyethylene naphthalate (PEN), liquid crystal polymer (LCP) and fully aromatic arylate (PAR); polyether such as polyether nitrile (PENT) and polyether ether ketone (PEEK); polysulfide such as polyphenylene sulfide (PPS); polystyrene such as syndiotactic polystyrene (SPS); aromatic polyether such as polyphenylene oxide (PPO); polyolefin such as polypropylene (PP) and poly 4-methyl-1-pentene (PMP); fluorinated resin such as tetrafluoroethylene/perfluoroalkoxy ethylene resin (PFA) and polytetrafluoroethylene (PTFE); and polyvinyl alcohol (EVOH).

Examples of the inorganic filler include inorganic particles of $Al_2O_3$ (aluminum oxide), ZnO (zinc oxide), $SiO_2$ (silicon oxide), $ZrO_2$ (zirconium oxide), $TiO_2$ (titanium oxide), SiC (silicon carbide), MgO (magnesium oxide), CaO (calcium oxide), zeolite, AlN (aluminum nitride), BN (boron nitride), $SnO_2$ (tin oxide), $Sb_2O_5$ (antimony oxide), ferrites, complex oxides of these compounds, calcium hydroxide, aluminum hydroxide, zirconium hydroxide, magnesium hydroxide, carbon black, clay, calcium carbonate, barium carbonate, dawsonite, hydrotalcite, calcium sulfate, magnesium carbonate, calcium silicate, potassium titanate, barium titanate, mica, montmorillonite, talc and the like.

Among these, the inorganic filler preferably includes at least one kind of inorganic particles of $Al_2O_3$ (aluminum oxide), $SiO_2$ (silicon oxide), $ZrO_2$ (zirconium oxide), $TiO_2$ (titanium oxide), SiC (silicon carbide), MgO (magnesium oxide), zeolite, AlN (aluminum nitride) and BN (boron nitride), more preferably includes at least one kind of inorganic particles of $Al_2O_3$ (aluminum oxide), $SiO_2$ (silicon oxide), $ZrO_2$ (zirconium oxide), $TiO_2$ (titanium oxide) and zeolite, further preferably includes at least inorganic particles of $SiO_2$ (silicon oxide).

Among silicon oxides, fumed silica is preferably used. Fumed silica can function also as a thickening agent or a thixotropy-imparting agent for the material for forming a passivation film. Further, by using hydrophilic fumed silica, water retentivity of the passivation film can be improved. Since a metal oxide such as fumed silica has a large number of hydroxy groups at its surface, it tends to interact with water and exhibit high water retentivity. Therefore, by adding fumed silica as an inorganic filler, water retentivity of the passivation film can be further improved.

In particular, in a case of forming a passivation film on a back surface, which is opposite to a light-receiving surface of a silicon photovoltaic cell, from the material for forming a passivation film for a semiconductor substrate, reflectivity can be improved by including a filler. In that case, $SiO_2$ is preferably used as the filler.

It is sufficient if the filler has a desired composition when a passivation film for a semiconductor substrate is formed. For example, in a case of using an inorganic filler as the filler, it is possible to apply and dry a material for forming a passivation film for a semiconductor substrate that contains an inorganic filler precursor, the specific resin and a liquid medium, in which the inorganic filler precursor turns to an inorganic filler during the drying process.

For example, when silane alkoxide, which is a precursor of $SiO_2$, is added to the material for forming a passivation film for a semiconductor substrate, the silane alkoxide turns to $SiO_2$ via hydrolysis and dehydration polycondensation during the drying process. In that case, acid or alkali may be added as a catalyst.

The average secondary particle size of the filler is not particularly restricted. In particular, the weight average particle size (50% D) is preferably from 10 nm to 30 µm, more preferably from 0.1 µm to 10 µm.

If the average secondary particle size of the filler is 10 nm or more, the filler can disperse in the material for forming a passivation film for a semiconductor more uniformly. If the average secondary particle size of the filler is 30 µm or less, effects of improving mechanical strength, water retentivity, reflectivity and heat resistance tends to be sufficient.

The weight average particle size of the filler may be measured with a laser scattering diffraction particle size distribution analyzer or the like.

The content of the filler is not particularly restricted. The content of the filler is preferably from 0.1% by mass to 200% by mass with respect to the content of the specific resin contained in the material for forming a passivation film for a semiconductor substrate. If the content is 0.1% by mass or more, an effect of adding a filler may be sufficient. If the content is 200% by mass or less, decrease in softness of the passivation film can be suppressed and formation of pinholes can be suppressed.

(Metal Alkoxide)

The material for forming a passivation film for a semiconductor substrate may include a metal alkoxide. By including a metal alkoxide, a sol-gel reaction, which is caused by the metal alkoxide, progresses during a process of forming a coating by applying the material for forming a passivation film for a semiconductor substrate onto a semiconductor substrate and drying the same. As a result, a metal oxide, which is derived from the metal alkoxide, is uniformly dispersed in the passivation film, thereby improving water retentivity of the passivation film. That is, by adding a metal alkoxide as a material that turns to an inorganic filler during heat treatment such as drying, an inorganic filler can be uniformly dispersed in the material for forming a passivation film for a semiconductor substrate.

Therefore, although the detailed reason is not clear, it is considered that an excellent passivation effect can be maintained even after being subjected to high temperature conditions.

The metal atom at the center of a metal alkoxide is not particularly restricted as long as it can form a metal alkoxide. Specific examples include silicon, titanium, zirconium, aluminum, yttrium, lithium, copper, zinc, boron, gallium, germanium, phosphorus, antimony, vanadium, tantalum, tungsten and lanthanum.

From the viewpoint of the passivation effect, the metal alkoxide is preferably at least one kind selected from the group consisting of silicon alkoxide, titanium alkoxide, zirconium alkoxide and aluminum alkoxide, more preferably at least one kind selected from the group consisting of silicon alkoxide, titanium alkoxide and aluminum alkoxide, further preferably at least one kind of silicon alkoxide, particularly preferably at least one kind of tetraalkoxy silane.

The alkoxy group that constitutes the metal alkoxide is preferably a linear, branched or cyclic alkoxy group, more preferably a linear, branched or cyclic alkoxy group having 1 to 24 carbon atoms, further preferably a linear, branched or cyclic alkoxy group having 1 to 10 carbon atoms, particularly preferably a linear or branched alkoxy group having 1 to 4 carbon atoms.

Examples of the alkyl group of the alkoxy group include a methyl group, an ethyl group, a propyl group, a butyl group, an i-propyl group, an i-butyl group, a pentyl group, a hexyl group, an octyl group, a 2-ethylhexyl group, a t-octyl group, a decyl group, a dodecyl group, a tetradecyl group, a 2-hexyldecyl group, a hexadecyl group, an octadecyl group, a cyclohexylmethyl group and an octylcyclohexyl group.

The greater the carbon number of the alkoxy group is, the more stable and less reactive the metal alkoxide tends to be. Therefore, it is preferred to select a suitable alkoxy group depending on the conditions for forming a passivation film.

From the viewpoint of the passivation effect, the metal alkoxide is preferably at least one kind of a metal alkoxide that has a linear or branched alkoxy group of 1 to 24 carbon atoms and is selected from the group consisting of a silicon alkoxide, a titanium alkoxide, a zirconium alkoxide and an aluminum alkoxide; more preferably at least one kind of a metal alkoxide that has a linear or branched alkoxy group of 1 to 10 carbon atoms and is selected from the group consisting of a silicon alkoxide, titanium alkoxide, zirconium alkoxide and an aluminum alkoxide; further preferably at least one kind of a metal alkoxide that has a linear or branched alkoxy group of 1 to 4 carbon atoms and is selected from the group consisting of a silicon alkoxide, a titanium alkoxide, a zirconium alkoxide and an aluminum alkoxide; particularly preferably at least one kind of a silicon alkoxide that has a linear or branched alkoxy group of 1 to 4 carbon atoms.

The content of the metal alkoxide in the material for forming a passivation film for a semiconductor substrate may be selected appropriately according to the type of the metal alkoxide. For example, the content of the metal alkoxide with respect to the content of the specific resin is preferably from 0.1% by mass to 200% by mass, more preferably from 1% by mass to 50% by mass, further preferably from 5% by mass to 30% by mass. If the content of the metal alkoxide is 0.1% by mass or more, water retentivity tends to be sufficient. If the content of the metal alkoxide is 200% by mass or less, a passivation effect, brought by the polymer compound having an anionic group or a cationic group, tends to be sufficient.

The material for forming a passivation film for a semiconductor substrate may include a single kind of a metal alkoxide, or may include two or more kinds in combination.

If the material for forming a passivation film for a semiconductor substrate includes a metal alkoxide, the material preferably further includes at least one kind of an acidic compound or an alkaline compound, in addition to the metal alkoxide. By including an acidic compound or an alkaline compound, for example, the compound functions as a catalyst and makes it easy to control hydrolysis and dehydration polycondensation of the metal alkoxide to desired conditions. As a result, the passivation effect of the passivation film for a semiconductor substrate can be further improved.

Examples of the alkaline compound include a hydroxide of an alkali metal such as sodium hydroxide and potassium hydroxide, and ammonia.

Examples of the acidic compound include an inorganic proton acid and an organic proton acid. Examples of the inorganic proton acid include hydrochloric acid, sulfuric acid, boric acid, nitric acid, phosphoric acid, perchloric acid, tetrafluoroboric acid, hexafluoroarsenic acid and hydrogen bromide. Examples of the organic proton acid include formic acid, acetic acid, oxalic acid, methanesulfonic acid, citric acid, itaconic acid and malic acid.

Among these, the acidic group is preferably at least one kind selected from the group consisting of nitric acid, acetic acid, hydrochloric acid, phosphoric acid, formic acid, citric acid, oxalic acid, itaconic acid and malic acid, more preferably at least one kind selected from the group consisting of nitric acid, acetic acid and sulfuric acid.

If the material for forming a passivation film for a semiconductor substrate includes an acidic compound or an alkaline compound, the content thereof is preferably from 0.0001 mol to 2 mol, more preferably from 0.001 mol to 0.5 mol, with respect to 1 mol of the metal alkoxide. The acidic compound or the alkaline compound may be used alone or in a combination of two or more kinds.

If the material for forming a passivation film for a semiconductor substrate includes a metal alkoxide, at least one kind of a chemical modifier that can chelate a metal atom that constitutes the metal alkoxide may be further included. In that case, reactivity of the metal alkoxide can be controlled more easily.

Examples of the chemical modifier include acetoacetic acid ester compounds such as ethyl acetoacetate, 1,3-diketone compounds such as acetyl acetone, and acetoacetamide compounds such as N,N'-dimethylamino acetoacetamide.

If the material for forming a passivation film for a semiconductor substrate includes a chemical modifier, the content thereof is preferably from 0.01 mol to 2 mol, more preferably from 0.1 mol to 1.0 mol, with respect to 1 mol of the metal alkoxide. If the content of the chemical modifier is 2 mol or less, reduction in the rate of the sol-gel reaction tends to be suppressed. The chemical modifier may be used alone or in combination of two or more kinds.

(Liquid Medium)

The material for forming a passivation film for a semiconductor substrate preferably further includes a liquid medium, in addition to the specific resin. The specific resin may be dissolved in the liquid medium, or may be dispersed as a solid or an emulsion.

Examples of the liquid medium include water; halogenated aliphatic hydrocarbon solvents such as chloroform, dichloromethane, 1,2-dichloroethane, trichloroethane, tetrachloroethane, trichloroethylene and tetrachloroethylene; halogenated aromatic hydrocarbon solvents such as dichlorobenzene and trichlorobenzene; nitro compounds such as nitromethane and nitrobenzene; alkylbenzene compounds such as trimethylbenzene, tributylbenzene, tetramethylbenzene and pentamethylbenzene; heterocyclic compounds such as sulfolane; linear, branched or cyclic aliphatic saturated hydrocarbon solvents such as octane, decane and cyclohexane; aprotic polar solvents such as N,N-dimethyl acetamide, N,N-dimethyl formamide, dimethyl sulfoxide, N-methyl-2-pyrrolidone and hexamethyl phosphonamide; alcohol solvents such as methanol, ethanol, 1-propanol and 2-propanol; and phenol solvents such as phenol and cresol. The liquid medium may be selected from these solvents, but the invention is not limited thereto.

Among these, the material for forming a passivation film for a semiconductor substrate preferably includes at least an alcohol solvent, more preferably at least one kind selected from the group consisting of methanol, ethanol, 1-propanol and 2-propanol. By including at least one kind of alcohol solvent, wettability with respect to a semiconductor substrate, especially with respect to a silicon substrate, can be improved.

The content of the liquid medium in the material for forming a passivation film for a semiconductor substrate is not particularly restricted. For example, the content of the liquid medium in the total mass of the material for forming a passivation film for a semiconductor substrate is preferably from 1 part by mass to 99 parts by mass, more preferably from 40 parts by mass to 95 parts by mass, provided that the total mass of the material for forming a passivation film for a semiconductor substrate is 100 mass parts.

(Ionic Liquid)

The material for forming a passivation film for a semiconductor substrate may include an ionic liquid. The material for forming a passivation film for a semiconductor substrate that includes an ionic liquid can be prepared by mixing and dispersing an ionic liquid in the specific resin in advance. An ionic liquid is a salt that has a melting point of 100° C. or less and exhibits a liquid form at a low temperature of 100° C. or less.

The composition of the ionic liquid is not particularly restricted, and can be suitably used as long as it can disperse in the specific resin. Examples of the ionic liquid include cations such as ammonium, pyridinium, pyrolizinium, pyrrolium, oxazolium, oxazolinium, imidazolium, phosphonium and sulfonium, and anions such as $N(SO_2F)_2^-$, $N(SO_2CF_3)_2^-$, $N(SO_2C_2F_5)_2^-$, $BF_4^-$, $PF_6^-$, $CF_3SO_3^-$ and $CF_3CO_2^-$. It is also possible to use an ionic liquid in which a cation and an anion as mentioned above are combined. The ionic liquid may be used alone or in combination of two or more kinds.

Among the anions, hydrophobic anions such as $N(SO_2F)_2^-$, $N(SO_2CF_3)_2^-$, $N(SO_2C_2F_5)_2^-$, $CF_3SO_3^-$ and $CF_3CO_2^-$ are suitably used. By using a hydrophobic anion, handling of an ionic liquid, especially in an air atmosphere, becomes easy. Further, handling of the material for forming a passivation film for a semiconductor substrate, in which the ionic liquid is used, also becomes easy.

The ion conductivity of the ionic liquid is preferably 0.01 mS/cm or more, more preferably 0.1 mS/cm or more. When the ion conductivity is 0.01 mS/cm or more, an effect of mixing the ionic liquid in the specific resin is sufficient.

The ion conductivity of the ionic liquid is measured at 25° C. with an electrical conductivity analyzer.

The cation or the anion of the ionic liquid may be chemically bonded to a side chain of the specific resin.

If the material for forming a passivation film for a semiconductor substrate includes an ionic liquid, the content of the ionic liquid is preferably from 1 part by mass to 50 parts by mass with respect to 100 parts by mass of the specific resin.

(Silane Coupling Agent)

The material for forming a passivation film for a semiconductor substrate may further include a silane coupling agent.

By including a silane coupling agent, wettability with respect to a semiconductor substrate, especially with respect to a silicon substrate, can be improved.

The silane coupling agent is not particularly restricted, and may be selected appropriately from silane coupling agents that are commonly used.

If the material for forming a passivation film for a semiconductor substrate includes a silane coupling agent, the content of the silane coupling agent is preferably from 0.01 parts by mass to 20 parts by mass with respect to 100 parts by mass of the specific resin.

(Antistatic Polymer)

The material for forming a passivation film for a semiconductor substrate may further include an antistatic polymer. The antistatic polymer refers to a polymer in which an antistatic agent is mixed, or a polymer that exhibits an antistatic property by itself. The antistatic agent is preferably a surfactant. It is also possible to use a mixture of a proton conductive polymer and an antistatic polymer.

If the material for forming a passivation film for a semiconductor substrate includes an antistatic polymer, the content of the antistatic polymer is preferably from 0.1 parts by mass to 100 parts by mass with respect to 100 parts by mass of the specific resin.

(Surfactant)

The material for forming a passivation film for a semiconductor substrate may further include a surfactant. The surfactant may be any of a cationic surfactant, an anionic surfactant or a nonionic surfactant. By including a surfactant, there are cases in which a fixed charge is imparted to the passivation film more effectively.

If the material for forming a passivation film for a semiconductor substrate includes a surfactant, the content of the surfactant is preferably from 0.1 parts by mass to 5 parts by mass with respect to 100 parts by mass of the specific resin.

<Passivation Film for Semiconductor Substrate and Method of Producing the Same>

The passivation film for a semiconductor substrate according to the invention is a coating film that is formed on a semiconductor substrate from the material for forming a passivation film for a semiconductor substrate that contains a polymer compound having an anionic group or a cationic group. The passivation film for a semiconductor substrate exhibits an excellent surface passivation effect.

The method of producing a passivation film for a semiconductor substrate according to the invention includes a step of forming a coating layer by applying, onto a semiconductor substrate, the material for forming a passivation film for a semiconductor substrate, and a step of forming a coating film by drying the coating layer. According to the method, a passivation film for a semiconductor substrate that exhibits an excellent surface passivation effect can be formed.

The following is an example of the method of producing a passivation film for a semiconductor substrate with a material for forming a passivation film for a semiconductor substrate including a polymer compound having an anionic group.

First, a coating layer is formed by applying the material for forming a passivation film for a semiconductor substrate onto a p-type layer of a semiconductor substrate having a p-type layer. The p-type layer of the semiconductor substrate may be a p-type layer derived from a p-type semiconductor substrate, or may be a p-type layer formed on a semiconductor substrate as a p-type diffusion layer or as a $p^+$-type diffusion layer.

In the invention, the method preferably further includes a step of applying hydrofluoric acid onto the p-type layer of the semiconductor substrate, prior to the step of forming a coating layer. More preferably, the method further includes a step of applying an alkaline aqueous solution onto the p-type layer of the semiconductor substrate, prior to the step of applying hydrofluoric acid.

That is, it is preferred to wash the surface of the p-type layer with hydrofluoric acid prior to coating the p-type layer of the semiconductor substrate with the material for forming a passivation film for a semiconductor substrate, and it is more preferred to wash the surface of the p-type layer with hydrofluoric acid after washing the surface of the p-type layer with an alkaline aqueous solution.

By washing the surface of the semiconductor substrate with hydrofluoric acid, oxides (such as silicon oxide) that exist on the surface of the semiconductor substrate can be removed and the passivation effect tends to be further improved. In addition, dangling bonds that exist on the semiconductor substrate can be terminated by hydrogenating the same (for example, changing into Si—H bonds). The terminated state may be stabilized by applying the material for forming a passivation film for a semiconductor substrate.

Examples of the method of washing with an alkaline aqueous solution include RCA washing that is commonly known. For example, organic substances and particles on the surface of a semiconductor substrate can be removed by immersing the semiconductor substrate in a mixed solution of ammonia water and hydrogen peroxide water at 60° C. to 80° C.

The concentration of hydrogen fluoride in the hydrofluoric acid is not particularly restricted, but may be from 0.1% by mass to 40% by mass, preferably from 0.5% by mass to 10% by mass. When the concentration is 0.1% by mass or more, a sufficient effect of washing tends to be attained. When the concentration is 40% by mass or less, handling during the washing process does not deteriorate.

The washing is preferably carried out for from 10 seconds to 10 minutes, more preferably from 30 seconds to 5 minutes, in either case of alkali washing or hydrofluoric acid washing.

In a case of forming a passivation film for a semiconductor substrate with a material for forming a passivation film for a semiconductor that includes a polymer compound having a cationic group, a coating film is formed on a n-type layer of a semiconductor substrate having a n-type layer by forming a coating layer by applying the material for forming a passivation film for a semiconductor substrate, and drying the coating layer.

The n-type layer of the semiconductor substrate may be a n-type layer derived from a n-type semiconductor substrate, or may be a n-type diffusion layer or a n$^+$-type diffusion layer formed on a semiconductor substrate.

In the invention, the method preferably further includes a step of applying hydrofluoric acid on the n-type layer of the semiconductor substrate, prior to forming the coating layer. More preferably, the method further includes a step of washing with an alkaline aqueous solution prior to applying hydrofluoric acid.

That is, it is preferred to wash the surface of the n-type layer with hydrofluoric acid prior to coating the n-type layer of the semiconductor substrate with the material for forming a passivation film for a semiconductor substrate, and it is more preferred to wash the surface of the n-type layer with hydrofluoric acid after washing the surface of the n-type layer with an alkaline aqueous solution.

The washing of the surface of the n-type layer with hydrofluoric acid or alkaline aqueous solution may be similar to the washing of the surface of the p-type layer with hydrofluoric acid or alkaline aqueous solution, as mentioned above.

The method of forming a coating layer on a semiconductor substrate by applying the material for forming a passivation film for a semiconductor substrate is not particularly restricted, and any known method can be used. Specific examples of the method include dipping, printing, spin coating, brush coating, spray coating, doctor blading, roll coating and ink jetting.

The amount of the material for forming a passivation film for a semiconductor substrate to be applied may be selected appropriately according to purposes. For example, the amount can be adjusted such that the thickness of the passivation film for a semiconductor substrate to be formed is from 10 nm to 50 µm.

The passivation film for a semiconductor substrate can be formed on the semiconductor substrate by drying the coating layer that is formed from the material for forming a passivation film for a semiconductor substrate, thereby forming a coating film.

The conditions for drying the coating layer are not particularly restricted as long as a coating film can be formed. For example, the drying is preferably carried out at from 50° C. to 300° C.

The thickness of the passivation film for a semiconductor substrate, which is produced by the method of producing a passivation film for a semiconductor substrate, is not particularly restricted and may be selected appropriately according to purposes. For example, the thickness is preferably from 10 nm to 50 µm, more preferably from 100 nm to 30 µm, further preferably from 50 nm to 20 µm.

When the thickness of the passivation film for a semiconductor substrate is 10 nm or more, it tends to be easy to uniformly coat the entire region of desired portions of the surface of the semiconductor substrate. Further, the more the thickness is, the higher the surface passivation effect tends to be.

The thickness of the passivation film for a semiconductor substrate is measured by an ordinary method with a stylus profilometer (for example, manufactured by Ambios Technology).

The method described above relates to production of a passivation film for a semiconductor substrate by applying a material for forming a passivation film for a semiconductor substrate in a liquid form onto the surface of a semiconductor substrate. However, it is also possible to form a passivation film for a semiconductor substrate with a material for forming a passivation film for a semiconductor substrate that has been made into a film.

Specifically, the method of producing a passivation film for a semiconductor substrate may be a method including attaching, to a p-type layer or a n-type layer of a semiconductor substrate, a film of the material for forming a passivation film for a semiconductor substrate that includes a polymer compound having an anionic group or a cationic group.

In this method, it is also preferred to wash the p-type layer or the n-type layer on the semiconductor substrate with hydrofluoric acid prior to attaching the film of the material for forming a passivation film for a semiconductor substrate.

In the invention, it is possible to carry out crosslinking treatment of the specific resin, or other resins that may be included as necessary, in the passivation film that is obtained by applying the material for forming a passivation film for a semiconductor substrate to a semiconductor substrate and drying the same.

The method of crosslinking is not particularly restricted, and may be selected appropriately from ordinary methods.

<Photovoltaic Cell Element and Method of Producing the Same>

The photovoltaic cell element of the invention has a semiconductor substrate having a pn junction, an electrode, and a passivation film for a semiconductor substrate that is formed on the semiconductor substrate. The photovoltaic cell element exhibits excellent conversion efficiency.

The method of producing a photovoltaic cell element of the invention includes a step of forming a passivation film for a semiconductor substrate on a semiconductor substrate that has a pn junction and an electrode formed thereon. According to the method, a photovoltaic cell element that exhibits excellent conversion efficiency can be produced.

In the following, an exemplary embodiment of the method of producing a photovoltaic cell element of the invention is explained with reference to the drawings.

FIG. 1 is a sectional view schematically illustrating a process of an example of a method of producing a photovoltaic cell element having a passivation film for a semiconductor substrate. The drawing does not restrict the method of the invention in any way.

As shown in FIG. 1(a), p-type semiconductor substrate 1 has $n^+$-type diffusion layer 2 in the vicinity of the surface, and antireflection film 3 on the surface. A silicon nitride film, a titanium oxide film and the like are known to serve as antireflection film 3. A surface protection film of silicon oxide or the like (not shown) may exist between antireflection film 3 and $n^+$-type diffusion layer 2. Alternatively, the passivation film of the invention may be used as a surface protection film.

Next, as shown in FIG. 1(b), a material for forming back-surface electrodes 5 such as an aluminum electrode paste is applied to part of the back surface region, and the material is subjected to heat treatment. Back-surface electrodes 5 and $p^+$-type diffusion layers 4 are formed by allowing aluminum to diffuse.

Next, as shown in FIG. 1(c), front-surface electrodes 7 are formed by applying a paste for forming an electrode to a light-receiving surface side and subjecting the paste to heat treatment. By using a paste for forming an electrode that contains a glass powder capable of causing fire through, ohmic contacts are obtained by forming front-surface electrodes 7, which penetrate antireflection layer 3, on $n^+$-type diffusion layer 2.

Finally, as shown in FIG. 1(d), passivation film 6 is formed on portions of the p-type layer formed on the back side other than portions corresponding to back-surface electrodes 5, by applying a material for forming a passivation film for a semiconductor substrate, which includes a polymer compound having an anionic group, by screen printing or the like and drying. By forming back-side passivation film 6 on the p-type layer, a photovoltaic cell element that exhibits excellent power generation efficiency can be obtained.

In a photovoltaic cell element produced by a method including the steps as shown in FIG. 1, back-surface electrodes made of aluminum or the like can be formed in the form of a point contact structure. As a result, warpage of the substrate or the like can be suppressed.

Although FIG. 1(d) shows a method of forming a passivation film only on the back surface, it is also possible to form a passivation film also on the lateral sides (edges) of semiconductor substrate 1 (not shown) by applying the material for forming a passivation film for a semiconductor substrate. In that case, a photovoltaic cell element that exhibits even more excellent power generation efficiency can be produced.

It is also possible to form a passivation film only on the lateral sides by applying the material for forming a passivation film for a semiconductor substrate and drying, without forming a passivation film on the back surface. The effect of the material for forming a passivation film for a semiconductor substrate of the invention is particularly significant when it is used at portions at which a large number of crystal defects exist, such as lateral sides.

FIG. 1 illustrates an embodiment in which a passivation film is formed after the formation of electrodes. However, it is also possible to form an electrode of aluminum or the like on the entire region of the back surface by evaporation or the like, after the formation of the passivation film. In addition, it is also possible to form an electrode that does not need to be sintered at high temperature on the front surface.

Figure 2:
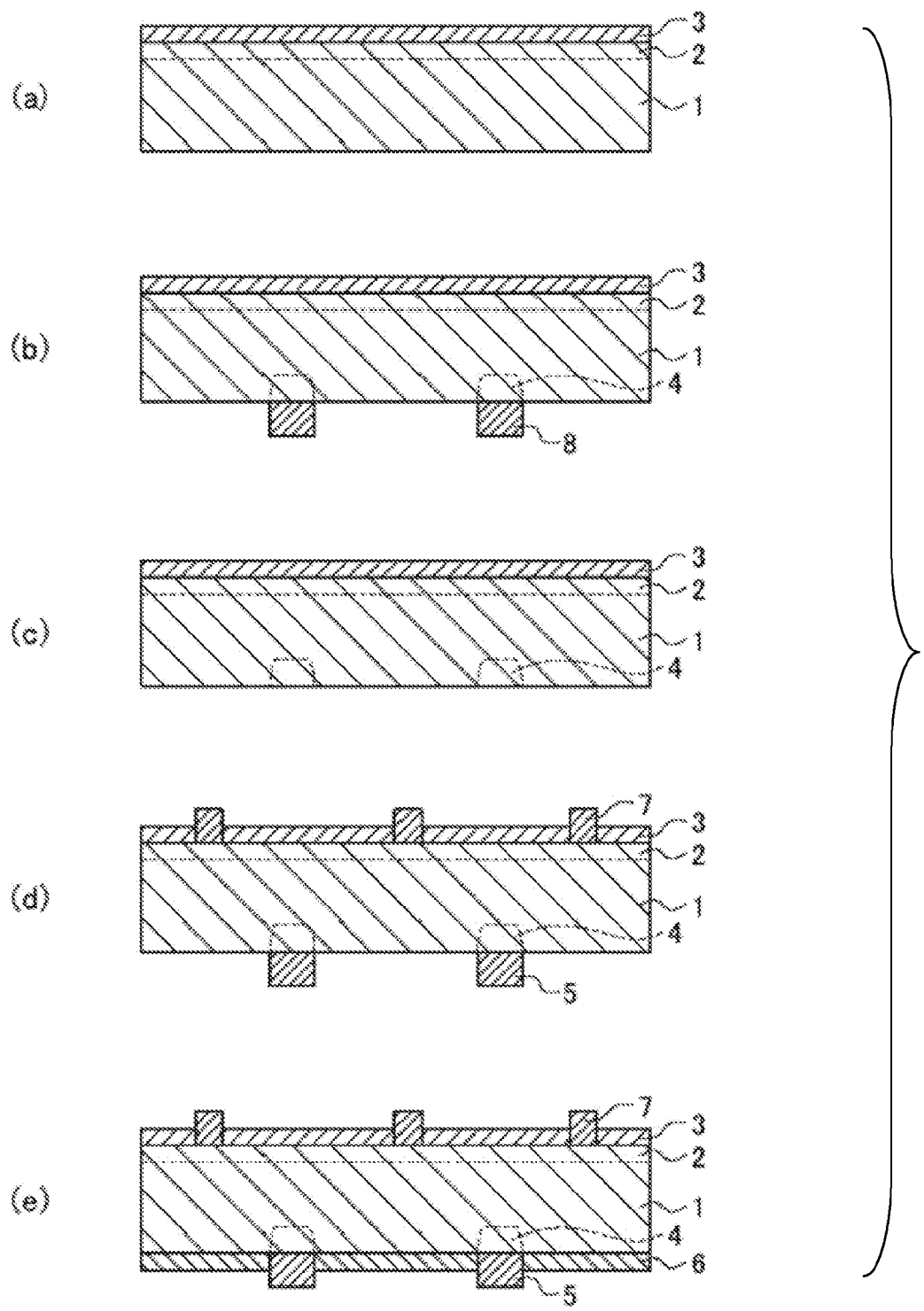
FIG. 2 is a schematic sectional view showing an example of a method of producing a photovoltaic cell element having a passivation film for a semiconductor substrate according to an embodiment of the present invention.

FIG. 2 is a sectional view schematically illustrating a process of another example of a method of producing a photovoltaic cell element having a passivation film for a semiconductor substrate. Specifically, FIG. 2 is a sectional view schematically illustrating a process including a step of forming a $p^+$-type diffusion layer with an aluminum electrode paste or with a p-type diffusion layer-forming composition, which is capable of forming a $p^+$-type diffusion layer through heat diffusion treatment; and a step of removing the aluminum electrode paste that has been subjected to heat treatment or the p-type diffusion layer-forming composition that has been subjected to heat treatment.

The p-type diffusion layer-forming composition may include, for example, a substance containing an acceptor element and a glass component.

As shown in FIG. 2(a), p-type semiconductor substrate 1 has $n^+$-type diffusion layer 2 in the vicinity of the surface, and antireflection film 3 on the surface. A silicon nitride film, a titanium oxide film and the like are known to serve as antireflection film 3.

Next, as shown in FIG. 2(b), a p-type diffusion layer-forming composition is applied to part of the back surface region, and the composition is subjected to heat treatment, whereby $p^+$-type diffusion layers 4 are formed. On $p^+$-type diffusion layers 4, the $p^+$-type diffusion layer-forming composition that has been subjected to heat treatment is formed.

An aluminum electrode paste may be used instead of the p-type diffusion layer-forming composition. In a case of using an aluminum electrode paste, aluminum electrodes 8 are formed on $p^+$-type diffusion layers 4.

Next, as shown in FIG. 2(c), the p-type diffusion layer-forming composition that has been subjected to heat treatment 8 or aluminum electrodes 8, formed on $p^+$-type diffusion layers 4, are removed by etching or the like.

Next, as shown in FIG. 2(d), front-surface electrodes 7 and back-surface electrodes 5 are formed by selectively applying an electrode-forming paste onto portions of the light-receiving side (front surface) and portions of the back surface, and subjecting the same to heat treatment. By using an electrode-forming paste including a glass powder capable of causing fire through for the light-receiving side, ohmic contacts are obtained, as shown in FIG. 2(c), by forming front-surface electrodes 7, which penetrates antireflection film 3, on $n^+$-type diffusion layer 2.

Since $p^+$-type diffusion layers 4 are already formed on the region on which back-surface electrodes 5 are to be formed, the paste for forming back-surface electrodes 5 it not restricted to an aluminum electrode paste, and a paste capable of forming an electrode with a lower resistance, such as a silver electrode paste, can be used. In that case, it becomes possible to further increase the power generation efficiency.

Finally, as shown in FIG. 2(e), passivation film 6 is formed on a region of the p-type layer at the back surface other than portions corresponding to back-surface electrodes 5, by applying the material for forming a passivation film for a semiconductor substrate, which includes a polymer compound having an anionic group, and drying the same. By forming back-surface passivation film 6 on the p-type layer, a photovoltaic cell element that exhibits excellent power generation efficiency can be produced.

Although FIG. 2(e) shows a method of forming a passivation film only on the back surface, it is also possible to form a passivation film also on the lateral sides (edges) of semiconductor substrate 1 (not shown) by applying the material for forming a passivation film for a semiconductor substrate. In that case, a photovoltaic cell element that exhibits even more excellent power generation efficiency can be produced.

Further, it is possible to form a passivation film only on the lateral sides by applying the material for forming a passivation film for a semiconductor substrate and drying, without forming a passivation film on the back surface. The effect of the material for forming a passivation film for a semiconductor substrate of the invention is particularly significant when it is used at portions at which a large number of crystal defects exist, such as lateral sides.

FIG. 2 illustrates an embodiment in which a passivation film is formed after the formation of electrodes. However, it is also possible to form an electrode of aluminum or the like on the entire region of the back surface by evaporation or the like, after the formation of the passivation film. In addition, it is also possible to form an electrode that does not need to be sintered at high temperature on the front surface.

In the embodiments as descried above, a p-type semiconductor substrate having a $n^+$-type diffusion layer formed on the light-receiving side is used. However, it is also possible to produce a photovoltaic cell element by using an n-type semiconductor substrate having a $p^+$-diffusion layer formed on the light-receiving side. In that case, a $n^+$-type diffusion layer is formed on the back surface of the semiconductor substrate.

The material for forming a passivation film for a semiconductor substrate of the invention can be used also for forming passivation film 6 on the light-receiving side or the back side of a back surface electrode-type photovoltaic cell element, in which electrodes are formed only on the back surface thereof.

Figure 3:
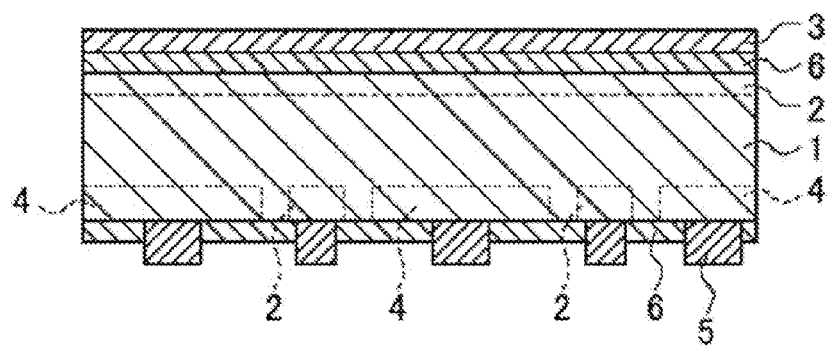
FIG. 3 is a schematic sectional view showing an example of a method of producing a photovoltaic cell element having a passivation film for a semiconductor substrate according to an embodiment of the present invention.

As shown in the schematic sectional view of FIG. 3, on the light-receiving side of p-type semiconductor substrate 1, $n^+$-type diffusion layer 2 is formed in the vicinity of the surface, and passivation film 6 and antireflection film 3 are formed on $n^+$-type diffusion layer 2. A silicon nitride film, a titanium oxide film or the like is known to serve as antireflection film 3. Passivation film 6 is formed by applying the material for forming a passivation film for a semiconductor substrate and drying the same.

On the back surface of p-type semiconductor substrate 1, back-surface electrodes 5 are formed on $p^+$-type diffusion layers 4 and $n^+$-type diffusion layers 2, respectively. Further, passivation film 6 is formed on the region on which the back-surface electrodes are not formed.

It is possible to form $p^+$-type diffusion layer 4 by applying a p-type diffusion layer-forming composition or an aluminum electrode paste onto desired portions and subjecting the same to heat treatment, as described above. Further, it is possible to form $n^+$-type diffusion layer 2 by applying a n-type diffusion layer-forming composition, which is capable of forming a $n^+$-type diffusion layer by thermal diffusion treatment, for example, to desired portions and subjecting the same to teat treatment.

The n-type diffusion layer-forming composition may include, for example, a substance containing a donor element and a glass component.

Back-surface electrodes 5, which are formed on $p^+$-type diffusion layers 4 and $n^+$-type diffusion layers 2, respectively, may be formed with a paste that is commonly used for forming electrodes, such as a silver electrode paste.

Further, back-surface electrodes 5 formed on $p^+$-type diffusion layers 4 may be aluminum electrodes that are formed from an aluminum electrode paste in the same process of forming $p^+$-type diffusion layers 4.

Passivation film 6 for the back surface may be formed by applying the material for forming a passivation film for a semiconductor substrate onto regions on which back-surface electrodes 5 are not formed, and drying the same. It is also possible to form passivation film 6 not only on the back surface of semiconductor substrate 1 but also lateral sides thereof (not shown).

The back-surface electrode-type photovoltaic cell element as shown in FIG. 3, in which electrodes are not formed on the light-receiving side, exhibits excellent power generation efficiency since. Further, since a passivation film is formed on regions on which back-surface electrodes are not formed, the photovoltaic cell element exhibits even more excellent power generation efficiency.

EXAMPLES

In the following, the invention will be explained more concretely with reference to the examples. However, the invention is not limited to the examples. Reagents were used as the chemicals, unless otherwise specified. The values indicated by % are on the mass basis, unless otherwise specified.

Example 1

Application of Material for Forming Passivation Film

A single-crystal p-type silicon substrate having a mirror surface (manufactured by SUMICO Corporation, 25 mm×25 mm, thickness: 625 μm) was used as the semiconductor substrate. The silicon substrate was washed for 5 minutes at 70° C. with an RCA washing solution (FRONTIER CLEANER-A01, trade name, manufactured by Kanto Chemical Co., Inc.), and was immersed in hydrofluoric acid (2.5% by mass) at room temperature for 5 minutes. Subsequently, the semiconductor substrate was washed with water and washed with ethanol, and then air-dried.

Then, one surface of the silicon substrate was applied with a 5% NAFION resin dispersion (1-propanol/2-propanol=45/55 (mass ratio), water: 15%-20%, manufactured by Sigma-Aldrich Co.), as a material for forming a passivation film for a semiconductor substrate, with a spin coater. The spin coating was conducted at 2000 rpm for 30 seconds. Thereafter, the silicon substrate was dried on a hot plate at 90° C. for 10 minutes, and was cooled at room temperature.

(Measurement of Conductivity of Specific Resin)

The conductivity of the specific resin was measured in accordance with the following method. Specifically, the film of NAFION (trade name, manufactured by Sigma-Aldrich Co.) having a rectangular shape was pressed at both sides with platinum plates (width: 10 mm) on a self-produced probe for measurement made of TEFLON (trade name), and the impedance between the platinum plates was measured with 1260 FREQUENCY RESPONSE ANALYSER (trade name, manufactured by Solatron Analytical) in water at 25° C.

The measurement was carried out by changing the distance between the electrodes, and a gradient of plotted measured values of resistance estimated from the distance between the electrodes and the C—C plot was obtained. The conductivity from which the contact resistance between the film and the platinum plates was canceled was calculated from the following formula. The result was defined as the conductivity of the specific resin.

Calculation formula of conductivity:

Conductivity [mS/cm]=1/(film width [cm]×film thickness [cm]×gradient in resistance between electrodes [Ω/cm])×100

The conductivity of the NAFION resin was 11 mS/cm.

(Measurement of Effective Lifetime)

The effective lifetime of the silicon substrate on which a passivation film was formed by the process as mentioned above was measured with a lifetime measurement apparatus (WT-2000PVN, trade name, manufactured by Semilab Japan K.K.) by a microwave reflectance photoconductivity decay method. The effective lifetime was 110 μs. The measurement was conducted at 25° C.

(Measurement of Thickness of Passivation Film)

The thickness of the passivation film formed on the silicon substrate by the process as mentioned above was measured with a stylus profilometer (manufactured by Ambios Technology). The thickness of the passivation film was 0.32 μm. The result is shown in Table 1.

Example 2

A passivation film was formed on a silicon substrate in a similar manner to Example 1, except that washing with hydrofluoric acid was not conducted. Evaluation was conducted with the silicon substrate on which the passivation film was formed in a similar manner to Example 1.

The effective lifetime was 50 μs. The thickness of the passivation film was 0.31 μm.

Example 3

A passivation film was formed on a silicon substrate in a similar manner to Example 1, except that the passivation film was formed by immersing the silicon substrate in a 5% NAFION resin dispersion (1-propanol/2-propanol=45/55 (mass ratio), water: 15%-20%, manufactured by Sigma-Aldrich Co.) and air-drying, further drying at 90° C. for 10 minutes, and cooling at room temperature.

Evaluation was conducted with the silicon substrate on which the passivation film was formed in a similar manner to Example 1.

The effective lifetime was 250 μs. The thickness of the passivation film was 0.90 μm.

Example 4

A passivation film was formed on a silicon substrate in a similar manner to Example 1, except that the passivation film was formed with a 5% sulfonated styrene-olefin copolymer resin solution (sulfonated polystyrene-block-poly(ethylene-ran-butylene)block-polystyrene, 1-propanol, dichloroethane dispersion, manufactured by Sigma-Aldrich Co.), instead of the 5% NAFION resin dispersion.

Evaluation was conducted with the silicon substrate on which the passivation film was formed in a similar manner to Example 1.

The effective lifetime was 90 μs. The thickness of the passivation film was 0.56 μm.

The conductivity of the sulfonated styrene-olefin copolymer resin was measured by forming a film from the resin, in a similar manner to Example 1. The conductivity was 10 mS/cm.

Example 5

A passivation film was formed on a silicon substrate in a similar manner to Example 3, except that the passivation film was formed with a 5% sulfonated styrene-olefin copolymer resin solution (sulfonated polystyrene-block-poly(ethylene-ran-butylene)block-polystyrene, 1-propanol, dichloroethane dispersion, manufactured by Sigma-Aldrich Co.), instead of the 5% NAFION resin dispersion.

Evaluation was conducted with the silicon substrate on which the passivation film was formed in a similar manner to Example 1.

The effective lifetime was 210 μs. The thickness of the passivation film was 1.10 μm.

Example 6

Synthesis Example 1

Synthesis of Sulfonated Polyarylether Sulfone

The reagents used for the synthesis were vacuum-dried at 105° C. for 4 hours. Thereafter, 20.0 g (39.3 mmol) of sodium bis(4-chloro-3-sulfophenyl)sulfonate, 11.3 g (39.3 mmol) of 4,4'-dichlorordiphenyl sulfone, 15.9 g (78.5 mmol) of 4,4'-dihydroxydiphenyl ether and 13.0 g (94.3 mmol) of potassium carbonate were placed in a 500-ml separable flask, and this was subjected to vacuum-drying for 1 hour under the same conditions as the above.

Then, the inside of the system was rapidly substituted with nitrogen, and 20 ml of NMP (N-methylpyrrolidone) and 150 ml of toluene were added under a nitrogen flow, and the mixture was agitated for 30 minutes at room temperature. Thereafter, water generated in the system was removed by preparing an azeotrope with toluene at a reaction temperature of 160° C.

Subsequently, the mixture was allowed to react for 50 hours at a reaction temperature of 180° C. The reacted mixture was added to a 5% hydrochloric acid aqueous solution, and a polymer was separated by reprecipitation. The polymer was washed with distilled water and collected by carrying out suction filtration with filter paper. The collected polymer was dried in a drying machine at 110° C. for 8 hours, whereby sulfonated polyaryl ether sulfone was obtained as the specific resin.

A 10% NMP solution was prepared by using 0.60 g of the specific resin prepared in Synthesis Example 1. The solution was cast on a glass plate and dried to form a film. Then, the film was immersed in a 20% sulfuric acid aqueous solution and the solution was stirred for 1 hour. Thereafter, washing was carried out 3 times and a film of the specific resin was obtained.

The conductivity of the film of the specific resin as measured by the process mentioned above was 10 mS/cm.

The specific resin obtained above was dissolved in methanol (liquid medium) to obtain a 10% methanol solution. The methanol solution of the specific resin was applied on a silicon substrate and dried to form a passivation film, in a similar manner to Example 1.

Evaluation was conducted with the silicon substrate on which the passivation film was formed in a similar manner to Example 1.

The effective lifetime was 90 μs. The thickness of the passivation film was 0.45 μm.

Example 7

A passivation film was formed on a silicon substrate in a similar manner to Example 6, except that NMP was used as the liquid medium instead of methanol.

Evaluation was conducted with the silicon substrate on which the passivation film was formed in a similar manner to Example 1.

The effective lifetime was 45 μs. The thickness of the passivation film was 0.52 μm.

Example 8

A 25% poly(styrene sulfonic acid) aqueous solution (manufactured by Sigma-Aldrich Co.) was evaporated to dryness, and the residue was dissolved in methanol to prepare a 25% poly(styrene sulfonic acid) methanol solution.

A passivation film was formed on a silicon substrate in a similar manner to Example 1, except that the 25% poly(styrene sulfonic acid) methanol solution was used instead of the 5% NAFION resin dispersion.

Evaluation was conducted with the silicon substrate on which the passivation film was formed in a similar manner to Example 1.

The effective lifetime was 90 μs. The thickness of the passivation film was 0.35 μm.

The poly(styrene sulfonic acid) was made into a film and conductivity of the film was measured in a similar manner to Example 1. The result was 10 mS/cm.

Example 9

Preparation of Material for Forming Passivation Film for Semiconductor Substrate $SiO_2$ particles (manufactured by Kojundo Chemical Laboratory Co., Ltd., weight-average particle size (50% D): 1 μm, purity: 99.9%) were added to a 5% NAFION resin dispersion (1-propanol/2-propanol=45/55 (mass ratio), water: 15%-20%, manufactured by Sigma-Aldrich Co.) and the mixture was subjected to ultrasonic dispersion, thereby preparing a NAFION resin dispersion containing $SiO_2$ as a material for forming a passivation film for a semiconductor substrate. The content of $SiO_2$ was adjusted to 1% by mass with respect to NAFION resin.

(Formation of Passivation Film)

A single-crystal p-type silicon substrate having a mirror surface (manufactured by SUMICO Corporation, 25 mm×25 mm, thickness: 625 μm) was used as the semiconductor substrate. The silicon substrate was washed for 5 minutes at 70° C. with an RCA washing solution (FRONTIER CLEANER-A01, trade name, manufactured by Kanto Chemical Co., Inc.), and was immersed in hydrofluoric acid (2.5% by mass) at room temperature for 5 minutes. Subsequently, the semiconductor substrate was washed with water and washed with ethanol, and then air-dried.

Then, the silicon substrate was dipped in the NAFION resin dispersion containing $SiO_2$ prepared above. Thereafter, the silicon substrate was dried on a hot plate at 90° C. for 10 minutes, and was cooled at room temperature, whereby a passivation film, which was a composite film of $SiO_2$ and NAFION, was obtained.

(Measurement of Effective Lifetime)

The lifetime of the silicon substrate on which the passivation film was formed in the above process was measured in a similar manner to Example 1. The effective lifetime was 270 μs.

(Measurement of Thickness of Passivation Film)

The thickness of the passivation film was measured in a similar manner to Example 1. The thickness of the passivation film was 1.30 μm.

Example 10

A material for forming a passivation film for a semiconductor substrate was prepared in a similar manner to Example 9, except that the content of $SiO_2$ with respect to NAFION resin was 5% by mass. A passivation film was formed on the silicon substrate with the material for forming a passivation film for a semiconductor substrate.

Evaluation was conducted with the silicon substrate on which the passivation film was formed in a similar manner to Example 9.

The effective lifetime was 250 μs. The thickness of the passivation film was 1.30 μm.

Example 11

A material for forming a passivation film for a semiconductor substrate was prepared in a similar manner to Example 9, except that the content of $SiO_2$ with respect to NAFION resin was 10% by mass. A passivation film was formed on the silicon substrate with the material for forming a passivation film for a semiconductor substrate.

Evaluation was conducted with the silicon substrate on which the passivation film was formed in a similar manner to Example 9.

The effective lifetime was 230 μs. The thickness of the passivation film was 1.40 μm.

Example 12

A material for forming a passivation film for a semiconductor substrate was prepared in a similar manner to Example 9, except that the content of $SiO_2$ with respect to NAFION resin was 20% by mass. A passivation film was formed on the silicon substrate with the material for forming a passivation film for a semiconductor substrate.

Evaluation was conducted with the silicon substrate on which the passivation film was formed in a similar manner to Example 9.

The effective lifetime was 300 μs. The thickness of the passivation film was 1.40 μm.

Example 13

A material for forming a passivation film for a semiconductor substrate was prepared in a similar manner to Example 9, except that the content of $SiO_2$ with respect to NAFION resin was 50% by mass, and a passivation film was formed on the silicon substrate with the material for forming a passivation film for a semiconductor substrate.

Evaluation was conducted with the silicon substrate on which the passivation film was formed in a similar manner to Example 9.

The effective lifetime was 270 μs. The thickness of the passivation film was 1.50 μm.

Example 14

A material for forming a passivation film for a semiconductor substrate was prepared in a similar manner to Example 9, except that the content of $SiO_2$ with respect to NAFION resin was 100% by mass. A passivation film was formed on the silicon substrate with the material for forming a passivation film for a semiconductor substrate.

Evaluation was conducted with the silicon substrate on which the passivation film was formed in a similar manner to Example 9.

The effective lifetime was 300 μs. The thickness of the passivation film was 1.50 μm.

Example 15

A passivation film was formed on a silicon substrate in a similar manner to Example 9, except that a 5% sulfonated styrene-olefin copolymer resin solution (sulfonated polystyrene-block-poly(ethylene-ran-butylene)block-polystyrene, 1-propanol, dichloroethane dispersion, manufactured by Sigma-Aldrich Co.), instead of the 5% NAFION resin dispersion.

Evaluation was conducted with the silicon substrate on which the passivation film was formed in a similar manner to Example 9.

The effective lifetime was 210 μs. The thickness of the passivation film was 0.80 μm.

Example 16

A material for forming a passivation film for a semiconductor substrate was prepared in a similar manner to Example 11, except that fumed silica (AEROSIL 200, trade name, manufactured by Nippon Aerosil Co., Ltd., weight-average particle size (50% D): 0.3 μm, BET specific surface area: 200 $m^2$/g) was used instead of $SiO_2$ particles (manufactured by Kojundo Chemical Laboratory Co., Ltd., weight-average particle size (50% D): 1 μm, purity: 99.9%), and a passivation film was formed on a silicon substrate with the material for forming a passivation film for a semiconductor substrate.

Evaluation was conducted with the silicon substrate on which the passivation film was formed in a similar manner to Example 9.

The effective lifetime was 240 μs. The thickness of the passivation film was 0.80 μm.

Example 17

Preparation of Material for Forming Passivation Film for Semiconductor Substrate A material for forming a passivation film for a semiconductor substrate was prepared by adding 0.35 g of tetraethoxysilane (manufactured by Tama Chemicals Co., Ltd.) and 0.035 g of a 10% $HNO_3$ aqueous solution to 10 g of a 5% NAFION resin dispersion (perfluoropolyolefin sulfonic acid derivative, 1-propanol/2-propanol=45/55 (mass ratio), water: 15%-20%, manufactured by Sigma-Aldrich Co.), and a passivation film was formed on a silicon substrate in a similar manner to Example 9.

Evaluation was conducted with the silicon substrate on which the passivation film was formed in a similar manner to Example 9.

The effective lifetime was 270 μs. The thickness of the passivation film was 0.42 μm.

Example 18

A material for forming a passivation film for a semiconductor substrate was prepared by adding 0.18 g of tetraethoxysilane (manufactured by Tama Chemicals Co., Ltd.) and 0.018 g of a 10% $HNO_3$ aqueous solution to 10 g of a 5% NAFION resin dispersion (perfluoropolyolefin sulfonic acid derivative, 1-propanol/2-propanol=45/55 (mass ratio), water: 15%-20%, manufactured by Sigma-Aldrich Co.), and a passivation film was formed on a silicon substrate in a similar manner to Example 9.

Evaluation was conducted with the silicon substrate on which the passivation film was formed in a similar manner to Example 9.

The effective lifetime was 250 μs. The thickness of the passivation film was 0.40 μm.

Example 19

Sulfonated polystyrene was obtained by allowing an aqueous solution of sulfonated polystyrene (manufactured by Wako Chemical Ltd.) to evaporation to dryness at 150° C. The sulfonated polystyrene was dissolved in ethanol. Subsequently, water, 2-propanol, tetraethoxysilane and a 10% $HNO_3$ aqueous solution were added, thereby preparing a material for forming a passivation film for a semiconductor substrate. The component ratio (sulfonated polystyrene/ethanol/2-propanol/water/tetraethoxysilane/10% $HNO_3$ aqueous solution) was 5/76.15/5/10/3.5/0.35 (mass ratio).

A passivation film was formed on a silicon substrate with the material for forming a passivation film for a semiconductor substrate as prepared above, and evaluation was conducted in a similar manner to Example 9.

The effective lifetime was 200 μs. The thickness of the passivation film was 0.38 μm.

Example 20

Sulfonated polystyrene was obtained by allowing an aqueous solution of sulfonated polystyrene (manufactured by Wako Chemical Ltd.) to evaporation to dryness at 150° C. The sulfonated polystyrene was dissolved in ethanol. Subsequently, water, 2-propanol, tetraethoxysilane and a 10% $HNO_3$ aqueous solution were added, thereby preparing a material for forming a passivation film for a semiconductor substrate. The component ratio (sulfonated polystyrene/ethanol/2-propanol/water/tetraethoxysilane/10% $HNO_3$ aqueous solution) was 5/72.3/5/10/7/0.7 (mass ratio).

A passivation film was formed on a silicon substrate with the material for forming a passivation film for a semiconductor substrate as prepared above, and evaluation was conducted in a similar manner to Example 9.

The effective lifetime was 190 μs. The thickness of the passivation film was 0.40 μm.

Example 21

Sulfonated polystyrene was obtained by allowing an aqueous solution of sulfonated polystyrene (manufactured by Wako Chemical Ltd.) to evaporation to dryness at 150° C. The sulfonated polystyrene was dissolved in ethanol. Subsequently, water, 2-propanol, tetraethoxysilane and a 10% $HNO_3$ aqueous solution were added, thereby preparing a material for forming a passivation film for a semiconductor substrate. The component ratio (sulfonated polystyrene/ethanol/2-propanol/water/tetraethoxysilane/10% $HNO_3$ aqueous solution) was 5/78.9/5/10/1.0/0.1 (mass ratio).

A passivation film was formed on a silicon substrate with the material for forming a passivation film for a semiconductor substrate as prepared above, and evaluation was conducted in a similar manner to Example 9.

The effective lifetime was 190 μs. The thickness of the passivation film was 0.35 μm.

Example 22

A semiconductor substrate for evaluation was prepared in a similar manner to Example 17, except that a passivation film was formed on a silicon substrate at a drying temperature of 250° C., and that a humidification treatment as described below was performed.

The humidification treatment was performed by placing the semiconductor substrate for evaluation at a position 5 cm above the surface of pure water heated at 100° C. for 10 seconds, such that the passivation film was in contact with a steam. Thereafter, the passivation film was dried with compressed air for 5 seconds.

The effective lifetime of the obtained semiconductor substrate for evaluation was 80 μs.

Example 23

A semiconductor substrate for evaluation was prepared in a similar manner to Example 19, except that after forming a passivation film on a silicon substrate by applying the material for forming a passivation film for a semiconductor substrate and drying at 90° C. for 10 minutes, the silicon substrate was allowed to stand at 25° C. and a relative humidity of 50%, for 2 hours.

The effective lifetime of the obtained semiconductor substrate for evaluation was 200 μs.

Example 24

A semiconductor substrate for evaluation was prepared in a similar manner to Example 23, except that the pretreatment of the substrate with 2.5% by mass hydrofluoric acid was not performed.

The effective lifetime of the obtained semiconductor substrate for evaluation was 130 μs.

TABLE 1

|  | Conductivity (mS/cm) | Thickness (μm) | Effective Lifetime (after drying at 90° C.) (μs) |
| --- | --- | --- | --- |
| Example 1 | 11 | 0.32 | 110 |
| Example 2 | 11 | 0.31 | 50 |
| Example 3 | 11 | 0.90 | 250 |
| Example 4 | 10 | 0.56 | 90 |
| Example 5 | 10 | 1.10 | 210 |
| Example 6 | 10 | 0.45 | 90 |
| Example 7 | 10 | 0.52 | 45 |
| Example 8 | 10 | 0.35 | 90 |
| Example 9 | 11 | 1.30 | 270 |
| Example 10 | 11 | 1.40 | 250 |
| Example 11 | 11 | 1.40 | 230 |
| Example 12 | 11 | 1.50 | 300 |
| Example 13 | 11 | 1.50 | 270 |
| Example 14 | 11 | 1.20 | 300 |
| Example 15 | 10 | 0.80 | 210 |
| Example 16 | 11 | 0.80 | 240 |
| Example 17 | 11 | 0.42 | 270 |
| Example 18 | 11 | 0.40 | 250 |
| Example 19 | 10 | 0.38 | 200 |
| Example 20 | 10 | 0.40 | 190 |
| Example 21 | 10 | 0.35 | 190 |
| Comparative Example 1 | — | — | 22 |
| Comparative Example 2 | 0.01 | 0.35 | 23 |
| Comparative Example 3 | 0.01 | 0.34 | 24 |
| Comparative Example 4 | 0.01 | 0.32 | 23 |
| Comparative Example 5 | 0.01 | 0.60 | 25 |

Silicon substrates on which a passivation film was formed were prepared in a similar manner to Examples 3, 5 and 9-21, except that the drying was performed for 10 minutes on a hot plate at different temperatures of 90° C., 150° C., 200° C. and 250° C., respectively. The effective lifetime of the obtained silicon substrates was evaluated in a similar manner to the above. The results are shown in Table 2.

TABLE 2

| | Effective Lifetime of Substrate dried at Different Temperatures (μs) | | | |
| --- | --- | --- | --- | --- |
| | 90° C. | 150° C. | 200° C. | 250° C. |
| Example 3 | 250 | 41 | 20 | 20 |
| Example 5 | 210 | 38 | 20 | 20 |
| Example 9 | 270 | 190 | 90 | 23 |
| Example 10 | 250 | 180 | 131 | 24 |
| Example 11 | 230 | 210 | 90 | 30 |
| Example 12 | 300 | 220 | 110 | 25 |
| Example 13 | 270 | 190 | 100 | 24 |
| Example 14 | 300 | 210 | 138 | 28 |
| Example 15 | 210 | 123 | 47 | 23 |
| Example 16 | 240 | 220 | 110 | 30 |
| Example 17 | 270 | 180 | 70 | 20 |
| Example 18 | 250 | 170 | 100 | 20 |
| Example 19 | 200 | 130 | 50 | 20 |
| Example 20 | 190 | 110 | 50 | 20 |
| Example 21 | 190 | 130 | 40 | 20 |

Comparative Example 1

The effective lifetime of a silicon substrate was measured in a similar manner to Example 1, except that the 5% NAFION resin dispersion was not applied on the silicon substrate.

The effective lifetime was 22 μs.

Comparative Example 2

A resin film was formed on a silicon substrate in a similar manner to Example 1, except that a 10% aqueous solution of polyvinyl alcohol (manufactured by Wako Pure Chemical Industries, Ltd., weight-average molecular weight: 20000, partially hydrolyzed) was used instead of the 5% NAFION resin dispersion. Evaluation was conducted with the silicon substrate on which the resin film was formed in a similar manner to Example 1.

The effective lifetime was 23 μs. The thickness of the passivation film was 0.35 μm.

Further, the 10% aqueous solution of polyvinyl alcohol was cast on a glass plate to prepare a film of polyvinyl alcohol, and conductivity of the film was measured in a similar manner to Example 1. The conductivity was lower than 0.01 mS/cm, which was below the measurable limit.

Comparative Example 3

A resin film was formed on a silicon substrate in a similar manner to Example 1, except that a 10% ethanol solution of polyethylene oxide (manufactured by Wako Pure Chemical Industries, Ltd., weight-average molecular weight: 20000) was used instead of the 5% NAFION resin dispersion. Evaluation was conducted with the silicon substrate on which the resin film was formed in a similar manner to Example 1.

The effective lifetime was 24 μs. The thickness of the passivation film was 0.34 μm.

Further, the 10% solution of polyethylene oxide with ethanol and water was cast on a glass plate to prepare a film of polyethylene oxide, and conductivity of the film was measured in a similar manner to Example 1. The conductivity was lower than 0.01 mS/cm, which was below the measurable limit.

Comparative Example 4

A resin film was formed on a silicon substrate in a similar manner to Example 3, except that the 10% ethanol solution of polyethylene oxide was used instead of the 5% NAFION resin dispersion. Evaluation was conducted with the silicon substrate on which the resin film was formed in a similar manner to Example 1.

The effective lifetime was 23 μs. The thickness of the passivation film was 0.32 μm.

Comparative Example 5

A resin film was formed on a silicon substrate in a similar manner to Example 3, except that a polyimide solution (PIX-1400, trade name, manufactured by HD MicroSystems, Ltd., concentration: 14.5%) was used instead of the 5% NAFION resin dispersion. Evaluation was conducted with the silicon substrate on which the resin film was formed in a similar manner to Example 1.

The effective lifetime was 25 μs. The thickness of the passivation film was 0.60 μm.

Further, the polyimide solution was cast on a glass plate to prepare a film of polyimide, and conductivity of the film was measured in a similar manner to Example 1. The conductivity was lower than 0.01 mS/cm, which was below the measurable limit.

As shown in the above, it is found that the effective life time of minority carriers inside or on the surface of a semiconductor substrate is significantly improved and an excellent passivation effect is obtained by forming a passivation film on the semiconductor substrate by applying and drying the material for forming a passivation film for a semiconductor substrate that contains the specific resin.

All publications, patent applications, and technical standards mentioned in this specification are herein incorporated by reference to the same extent as if each individual publication, patent application, or technical standard was specifically and individually indicated to be incorporated by reference.

This application claims priority under 35 USC 119 from Japanese Patent Application No. 2011-118494 filed May 26, 2011, No. 2011-118493 filed May 26, 2011, No. 2011-141068 filed Jun. 24, 2011 and No. 2012-055809 filed Mar. 13, 2012, the disclosure of which is incorporated by reference herein.

What is claimed is:

1. A material for forming a passivation film for a semiconductor substrate, the material comprising a polymer compound having an anionic group or a cationic group, wherein the anionic group comprises at least one selected from the group consisting of a sulfonic acid group, a phosphoric acid group, and a phosphonic acid group.

2. The material for forming a passivation film for a semiconductor substrate according to claim 1, wherein the polymer compound has a main chain formed from carbon and at least one element selected from the group consisting of hydrogen, fluorine, oxygen and sulfur.

3. The material for forming a passivation film for a semiconductor substrate according to claim 1, wherein the polymer compound has a main chain formed from carbon and at least one element selected from the group consisting of hydrogen, oxygen and sulfur.

4. The material for forming a passivation film for a semiconductor substrate according to claim 1, wherein the polymer compound has an aromatic group.

5. The material for forming a passivation film for a semiconductor substrate according to claim 1, wherein the polymer compound has a main chain formed from carbon and fluorine.

6. The material for forming a passivation film for a semiconductor substrate according to claim 1, wherein the polymer compound has a conductivity of 1 mS/cm or more in water at 25° C.

7. The material for forming a passivation film for a semiconductor substrate according to claim 1, wherein the polymer compound has a sulfonic acid group.

8. The material for forming a passivation film for a semiconductor substrate according to claim 1, further comprising a liquid medium.

9. The material for forming a passivation film for a semiconductor substrate according to claim 8, wherein the liquid medium comprises at least one selected from the group consisting of methanol, ethanol, 1-propanol and 2-propanol.

10. A passivation film for a semiconductor substrate that is a coating film formed on a semiconductor substrate from the material for forming a passivation film for a semiconductor substrate according to claim 1.

11. A photovoltaic cell element comprising a semiconductor substrate having a pn junction, an electrode, and the passivation film for a semiconductor substrate according to claim 10, wherein the passivation film is formed on the semiconductor substrate.

12. A method of producing a photovoltaic cell element, the method comprising forming the passivation film for a semiconductor substrate according to claim 10 on a semiconductor substrate that has a pn junction and has an electrode formed thereon.

13. A method of producing a passivation film for a semiconductor substrate, the method comprising:
    forming a coating layer by applying the material for forming a passivation film for a semiconductor substrate according to claim 1 onto a semiconductor substrate; and
    forming a coating film by drying the coating layer.

14. The method of producing a passivation film for a semiconductor substrate according to claim 13, further comprising applying hydrofluoric acid to the semiconductor substrate prior to the formation of the coating layer.

15. A material for forming a passivation film for a semiconductor substrate, the material comprising a polymer compound having an anionic group or a cationic group, wherein the polymer compound is at least one selected from the group consisting of a polyperfluoroolefin sulfonic acid derivative, a sulfonated polystyrene derivative and a sulfonated polyarylethersulfone.

16. A method of producing a passivation film for a semiconductor substrate, the method comprising:
    forming a coating layer by applying the material for forming a passivation film for a semiconductor substrate according to claim 15 onto a semiconductor substrate; and
    forming a coating film by drying the coating layer.

17. The method of producing a passivation film for a semiconductor substrate according to claim 16, further comprising applying hydrofluoric acid to the semiconductor substrate prior to the formation of the coating layer.

18. A method of producing a photovoltaic cell element, the method comprising forming a passivation film for a semiconductor substrate on a semiconductor substrate that has a pn junction and has an electrode formed thereon, wherein the passivation film is a coating film formed on a semiconductor substrate from the material for forming a passivation film for a semiconductor substrate according to claim 15.

19. A material for forming a passivation film for a semiconductor substrate, the material comprising a polymer compound having an anionic group or a cationic group, further comprising a filler.

20. The material for forming a passivation film for a semiconductor substrate according to claim 19, wherein the filler comprises an inorganic filler.

21. The material for forming a passivation film for a semiconductor substrate according to claim 20, wherein the inorganic filler comprises at least one selected from the group consisting of $Al_2O_3$, $SiO_2$, $ZrO_2$, $TiO_2$, SiC, MgO, zeolite, AlN and BN.

22. The material for forming a passivation film for a semiconductor substrate according to claim 20, wherein the inorganic filler comprises $SiO_2$.

23. The material for forming a passivation film for a semiconductor substrate according to claim 19, wherein the filler has a weight-average particle size (50% D) of from 10 nm to 30 μm.

24. The material for forming a passivation film for a semiconductor substrate according to claim 19, wherein a content of the filler with respect to a total content of the polymer compound is from 0.1% by mass to 200% by mass.

25. A material for forming a passivation film for a semiconductor substrate, the material comprising a polymer compound having an anionic group or a cationic group, further comprising a metal alkoxide.

26. The material for forming a passivation film for a semiconductor substrate according to claim 25, wherein the metal alkoxide comprises a silicon alkoxide.

27. The material for forming a passivation film for a semiconductor substrate according to claim 25, further comprising at least one acidic compound.

28. The material for forming a passivation film for a semiconductor substrate according to claim 25, wherein a content of the metal alkoxide with respect to a total content of the polymer compound is from 0.1% by mass to 200% by mass.

29. A method of producing a passivation film for a semiconductor substrate, the method comprising:
   forming a coating layer by applying the material for forming a passivation film for a semiconductor substrate according to claim 25 onto a semiconductor substrate; and
   forming a coating film by drying the coating layer.

30. The method of producing a passivation film for a semiconductor substrate according to claim 29, further comprising applying hydrofluoric acid to the semiconductor substrate prior to the formation of the coating layer.

31. A method of producing a photovoltaic cell element, the method comprising forming a passivation film for a semiconductor substrate on a semiconductor substrate that has a pn junction and has an electrode formed thereon, wherein the passivation film is a coating film formed on a semiconductor substrate from the material for forming a passivation film for a semiconductor substrate according to claim 25.

* * * * *